United States Patent
Weaver et al.

(10) Patent No.: US 11,751,455 B2
(45) Date of Patent: Sep. 5, 2023

(54) NON-COMMON CAPPING LAYER ON AN ORGANIC DEVICE

(71) Applicant: UNIVERSAL DISPLAY CORPORATION, Ewing, NJ (US)

(72) Inventors: Michael S. Weaver, Princeton, NJ (US); Michael Hack, Princeton, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 71 days.

(21) Appl. No.: 16/420,638

(22) Filed: May 23, 2019

(65) Prior Publication Data
US 2019/0326363 A1 Oct. 24, 2019

Related U.S. Application Data

(62) Division of application No. 14/507,104, filed on Oct. 6, 2014, now Pat. No. 10,340,313, which is a division
(Continued)

(51) Int. Cl.
*H10K 59/35* (2023.01)
*H10K 50/852* (2023.01)
(Continued)

(52) U.S. Cl.
CPC ......... *H10K 59/35* (2023.02); *H10K 50/8445* (2023.02); *H10K 50/85* (2023.02);
(Continued)

(58) Field of Classification Search
CPC ............. H01L 51/5253; H01L 51/5256; H01L 51/5262; H01L 51/5275; H01L 51/5281;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 1685770 A 10/2005
EP 0650955 5/1995
(Continued)

OTHER PUBLICATIONS

Adachi, Chihaya et al., "Organic Electroluminescent Device Having a Hole Conductor as an Emitting Layer," Appl. Phys. Lett, 55(15): 1489-1491 (1989).
(Continued)

*Primary Examiner* — Marcos D. Pizarro
(74) *Attorney, Agent, or Firm* — Duane Morris LLP

(57) ABSTRACT

An apparatus that includes a plurality of OLEDs provided on a first substrate is disclosed. Each OLED includes a first electrode, a second electrode disposed over the first electrode, and an organic electroluminescent material disposed between the first and the second electrodes. The apparatus also includes a first capping layer that is disposed over the second electrode of at least a first portion of the plurality of OLEDs such that the first capping layer is optically coupled to at least the first portion of the plurality of OLEDs, and a second capping layer. The second capping layer is disposed over the second electrode of at least a second portion of the plurality of OLEDs such that the second capping layer is optically coupled to the second portion of the plurality of OLEDs but not the first portion of the plurality of OLEDs, and the second portion of the plurality of OLEDs is different from the first portion of the plurality of OLEDs.

19 Claims, 7 Drawing Sheets

Related U.S. Application Data of application No. 13/163,132, filed on Jun. 17, 2011, now Pat. No. 8,884,316.

(51) Int. Cl.
| | |
|---|---|
| *H10K 50/858* | (2023.01) |
| *H10K 50/844* | (2023.01) |
| *H10K 59/38* | (2023.01) |
| *H10K 59/30* | (2023.01) |
| *H10K 50/86* | (2023.01) |
| *H10K 50/85* | (2023.01) |

(52) U.S. Cl.
CPC ......... *H10K 50/852* (2023.02); *H10K 50/858* (2023.02); *H10K 50/86* (2023.02); *H10K 59/30* (2023.02); *H10K 59/38* (2023.02)

(58) Field of Classification Search
CPC ............ H01L 27/3206; H01L 27/3211; H10K 50/8445; H10K 50/85; H10K 50/86; H10K 59/30; H10K 59/35; H10K 59/38
See application file for complete search history.

(56) References Cited

U.S. PATENT DOCUMENTS

| | | | |
|---|---|---|---|
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,998,085 A | 12/1999 | Isberg et al. | |
| 6,013,982 A | 1/2000 | Thompson et al. | |
| 6,087,196 A | 7/2000 | Sturm et al. | |
| 6,091,195 A * | 7/2000 | Forrest ................ H01L 51/5271 313/506 | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,895,667 B2 | 5/2005 | Forrest et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,694,439 B2 | 4/2010 | White et al. | |
| 7,808,173 B2 | 10/2010 | Kim et al. | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0011933 A1 | 1/2006 | Riess et al. | |
| 2006/0152150 A1 * | 7/2006 | Boerner ............ C09K 11/7786 313/506 | |
| 2006/0202194 A1 | 9/2006 | Jeong et al. | |
| 2006/0240279 A1 | 10/2006 | Adamovich et al. | |
| 2006/0244693 A1 | 11/2006 | Yamaguchi et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0023724 A1 | 1/2008 | Takeda et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0224968 A1 | 9/2008 | Kashiwabara | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0320446 A1 * | 12/2010 | Kang ................... H05B 33/10 257/40 | |
| 2011/0084291 A1 | 4/2011 | Jeong et al. | |
| 2011/0186820 A1 | 8/2011 | Kim et al. | |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| KR | 20060020050 | 3/2006 |
| KR | 100623731 | 9/2006 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072092 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008097046 | 8/2008 |
| WO | 2008101842 | 8/2008 |

(56) References Cited

FOREIGN PATENT DOCUMENTS

| WO | 2008132085 | 11/2008 |
|---|---|---|
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91:209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic LIght-Emitting Diodes with Phosphorescent Platinum Complexes Containing N∧C∧N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes Of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

(56) References Cited

OTHER PUBLICATIONS

Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Notice of Final Rejection dated Nov. 20, 2020 for corresponding Korean Patent Application No. 10-2020-0009061.
Paul Semenza, AMOLED Production: Enteriing a New Era? SID Information display, Mar./Apr. 2013.
H. Riel et al."Phosphorescent Top-Emitting Organic Light-Emitting Devices With Improved Light Outcoupling," Applied Physics Letters, vol. 82, No. 3 (Jan. 20, 2003).
H. Riel et al., "Tuning the Emission Characteristics of Top-Emitting Organic Light-Emitting Devices By Means of a Dielectric Capping Layer: An Experimental and Theoretical Study," Journal of Applied Physics, vol. 94, No. 8 (Oct. 15, 2003).
Lee et al., "A New Patterning Method for Full-Color Polymer Light-Emitting Devices: Laser Induced Thermal Imaging (LITI)," Proceedings of the Society for Information Display, Digest ofTechnical Papers 33:(suppl2), Boston, 2002, pp. 784-787.
Lee et al."A novel patterning method for full-color organic light-emitting devices: laser induced thermal imaging (LITI). Proceedings of the Society for Information Display," Digest of Technical Papers 35:(suppl2), Seattle, 2004, pp. 1008-1011.
T Hirano et al., Novel Laser Transfer Technology for Manufacturing Large-Sized Displays, Proceedings of the Society for Information Display, Digest ofTechnical Papers 38:(suppl2), Long Beach, 2007, pp. 1592-1595.
Noh et al., "High performance OLEDs with a new device structure," IMID 07, 33-1 (Aug. 29, 2007).
Huang, "High efficiency top-emitting organic light-emitting diodes: Design and fabrication" Dissertation, May 2007.
Chinese Patent Office, Notification of the First Office Action and English Version of Chinese Office Action regarding corresponding Chinese Application No. 201210286949.3 dated May 20, 2015 pp. 1-24.
Chinese Patent Office, Chinese Search Report regarding corresponding Chinese Application No. 201210286949.3 dated May 20, 2015 pp. 1-4.
Office Action dated Jan. 18, 2018 for corresponding Korean Patent Application No. 10-2012-0065127.

\* cited by examiner

NON-COMMON CAPPING LAYER ON AN ORGANIC DEVICE

CROSS-REFERENCE TO RELATED APPLICATIONS

This application is a divisional of U.S. application Ser. No. 14/507,104, filed on Oct. 6, 2014, which is a divisional of U.S. application Ser. No. 13/163,132, filed on Jun. 17, 2011, now patented as U.S. Pat. No. 8,884,316, issued on Nov. 11, 2014, the contents of which are incorporated herein by reference in entirety.

THE PARTIES TO A JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CEE coordinates, which are well known to the art.

One example of a green emissive molecule is tris (2-phenylpyridine) iridium, denoted $Ir(ppy)_3$, which has the structure of Formula 1:

In this, and later figures herein, we depict the dative bond, from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in, the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

A method for fabricating an organic device having a non-common capping layer is provided. A first method comprises providing a plurality of organic light emitting devices (OLEDs) on a first substrate. Each of the OLEDs includes a transmissive top electrode. The plurality of OLEDs includes a first portion of OLEDs and a second portion of OLEDs that is different from the first portion. The first method further includes depositing a first capping layer over at least the first portion of the plurality of OLEDs such that the first capping layer is optically coupled to at least the first portion of the plurality of OLEDs. A second capping layer is deposited over at least the second portion of the plurality of OLEDs such that the second capping layer is optically coupled to the second portion of the plurality of OLEDs but not the first portion of the plurality of OLEDs. It is preferable that, in the first method as described above, the second capping layer is not deposited through a patterned mask or, more preferably, through a fine metal mask (FMM). In some embodiments, the second capping layer is deposited using at least one of: laser induced thermal imaging (LITI) or laser induced pattern-wise sublimation (LIPS). Embodiments below referencing the "first method" may reference both embodiments comprising non-common capping layers deposited through an FMM, as well as embodiments in which the non-common capping layer is not deposited through an FMM.

In some embodiments, the first method as described above further includes depositing the first capping layer over at least the second portion of the plurality of OLEDs such that the first capping layer is optically coupled to the second portion of the plurality of OLEDs. In some embodiments, the first capping layer may comprise a blanket layer. In some embodiments, the first capping layer is not deposited over the second portion of the plurality of OLEDs such that the first capping layer is not optically coupled to the second portion of the plurality of OLEDs. In some embodiments, the plurality of OLEDs are transparent OLEDs and/or are top emission OLEDs.

In some embodiments, in the first method described above, the first capping layer has a first total optical path that is constant over the first portion of the plurality of OLEDs. The second capping layer may comprise a second total optical path that is constant over the second portion of the plurality of OLEDs. The first total optical path and the second total optical path are different.

In some embodiments, in the first method as described above, depositing the second capping layer comprises depositing the second capping layer onto portions of a second substrate and aligning the second capping layer over at least the second portion of the plurality of OLEDs. The second capping layer may be deposited onto the second substrate using at least one of: photolithography, LITI, LIPS, stamping, or inkjet printing. In some embodiments, the step of aligning the second capping layer over at least the second portion of the plurality of OLEDs comprises depositing the second capping layer onto portions of the second substrate such that the second capping layer is disposed over at least the second portion of the plurality of OLEDs when the second substrate is coupled to the first substrate. The second capping layer may be optically coupled to the first capping layer when the first substrate is coupled to the second substrate. In some embodiments, the second substrate is a display cover.

In some embodiments, in the first method as described above, depositing the first capping layer comprises either one of, or some combination of: fine metal mask (FMM) and vapor thermal evaporation (VTE). In some embodiments, none of the capping layers are deposited by either one of, or some combination of: FMM and VTE.

In some embodiments, in the first method as described above, the plurality of OLEDs may include a plurality of red OLEDs, a plurality of green OLEDs, and a plurality of blue OLEDs. The first portion of the plurality of OLEDs may comprise a plurality of OLEDs 310a, 310b, 310c that emit in blue. In some embodiments, the second portion of the plurality of OLEDs comprises a plurality of OLEDs 311a, 311b, 311c that emit in green and red. In some embodiments, the second portion of the plurality of OLEDs comprises a plurality of OLEDs 311a, 311b, 311c that emit in red. In some embodiments, the second portion of the plurality of OLEDs comprises a plurality of green OLEDs 311a, 311b, 311c.

In some embodiments, in the first method as described above, in which the plurality of OLEDs include a plurality of red OLEDs, a plurality of green OLEDs, and a plurality of blue OLEDs, the plurality of OLEDs may also include a third portion of OLEDs that is different from the first and second portions. The third portion of the plurality of OLEDs comprises a plurality of OLEDs 312a, 312b, 312c. The first method may further include the step of depositing a third capping layer over at least the third portion of the plurality of OLEDs such that the third capping layer is optically coupled to at least the third portion of the plurality of OLEDs. In some embodiments, the third capping layer is not optically coupled to the first portion and the second portion of the plurality of OLEDs. In some embodiments, the third capping layer is not optically coupled to the first portion or the second portion of the plurality of OLEDs. In some embodiments, the third capping layer is not deposited through a patterned mask or, preferably, through a FMM. The third capping layer may be deposited using at least one of: laser induced thermal imaging (LITI) or laser induced pattern-wise sublimation (LIPS)

In some embodiments, in the first method as described above, in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the step of depositing the third capping layer may comprise depositing the third capping layer onto portions of a second substrate and aligning the third capping layer over the third portion of the plurality of OLEDs. In some embodiments, the third capping layer may be deposited onto the second substrate using at least one of: photolithography, LITI, LIPS, stamping, or inkjet printing. In some embodiments, the third capping layer may be aligned by depositing the third capping layer onto portions of the second substrate such that the third capping layer is optically coupled to the third portion of the plurality of OLEDs when the second substrate is coupled to the first substrate. The third capping layer may also be optically coupled to the first capping layer when the first substrate is coupled to the second substrate. In some embodiments, the second substrate is a display cover or lighting panel.

In some embodiments, in the first method as described above, in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the third portion of the plurality of OLEDs may comprise a plurality of OLEDs 312a, 312b, 312c that emit in red. The second portion of the plurality of OLEDs may comprise a plurality of OLEDs 311a, 311b, 311c that emit in green. The first portion of the plurality of OLEDs may comprise a plurality of OLEDs 310a 310b, 310c that emit in blue.

In some embodiments, in the first method as described above, in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the third portion of the plurality of OLEDs may comprise a plurality of OLEDs 312a, 312b, 312c that emit in green. The second portion of the plurality of OLEDs may comprise a plurality of the red OLEDs 311a, 311b, 311c that emit in red. The first portion of the plurality of OLEDs may comprise a plurality of the blue OLEDs 310a 310b, 310c, that emit in blue.

In some embodiments, in the first method as described above, in which the plurality of OLEDs include a plurality of red OLEDs, a plurality of green OLEDs, and a plurality of blue OLEDs, the first capping layer may have a thickness that is optimized for at least one group of the plurality of red OLEDs, green OLEDs, and blue OLEDs. Preferably, the first capping layer has a thickness that is optimized for the plurality of blue OLEDs. In some embodiments, the first capping layer has an optical thickness that is less than approximately 125 nm. In some embodiments, the first capping layer has an optical thickness that is approximately within the range of 90 to 130 nm.

In some embodiments, in the first method as described above, in which the plurality of OLEDs include a plurality of red OLEDs, a plurality of green OLEDs, and a plurality of blue OLEDs, the first capping layer comprises $Alq_3$. In some embodiments, the first capping layer is substantially transparent for light having a wavelength approximately equal to a wavelength of light that is emitted by each OLED that the first capping layer is optically coupled to. In some embodiments, the first capping layer has an index of refraction that is approximately in the range of 1 and 2.5. Preferably, the first capping layer has an index of refraction that is approximately within the range of 1.5 and 2. In some embodiments, the first capping layer has an optical thickness that results in a loss of efficiency for the plurality of green OLEDs that is within the range of approximately 5 to 10%. In some embodiments, the first capping layer has an optical thickness that results in a loss of efficiency for the plurality of red OLEDs that is within the range of approximately 25 to 35%.

In some embodiments, in the first method as described above, in which the plurality of OLEDs include a plurality of red OLEDs, a plurality of green OLEDs, and a plurality of blue OLEDs, the second capping layer may have a thickness that is optimized for the plurality of red OLEDs and/or the plurality of green OLEDs. In some embodiments, the second capping layer has an optical thickness that is approximately within the range of 125 to 160 nm. In some embodiments, the first capping layer comprises $Alq_3$. In some embodiments, the second capping layer is substantially transparent for light having a wavelength approximately equal to a wavelength of light that is emitted by each OLED that the second capping layer is optically coupled to. In some embodiments, the second capping layer has an index of refraction that is approximately in the range of 1 and 2.5. Preferably, the second capping layer has an index of refraction that is approximately within the range of 1.5 and 2.

In some embodiments, in the first method as described above, in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the third capping layer has a thickness that is optimized for the plurality of red OLEDs and/or the plurality of green OLEDs. In some embodiments, the third capping layer has an optical thickness that is approximately within the range of 160 to 200 nm. In some embodiments, the first capping layer comprises $Alq_3$. In some embodiments, the third capping layer is substantially transparent for light having a wavelength approximately equal to a wavelength of light that is emitted by each OLED that the third capping layer is optically coupled to. In some embodiments, the third capping layer has an index of refraction that is approximately in the range of 1 and 2.5. Preferably, the third capping layer has an index of refraction that is approximately within the range of 1.5 and 2.

In some embodiments, in the first method as described above, in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the first capping layer has a thickness that is optimized for the plurality of blue OLEDs, the second capping layer has a thickness that is optimized for the plurality of green OLEDs, and the third capping layer has a thickness that is optimized for the plurality of red OLEDs. In some embodiments, the first capping layer has an optical thickness that is approximately within the range of 90 to 130 nm, the second capping layer has an optimal thickness that is approximately within range of 125 to 160 nm, and the third capping layer has an optical thickness that is approximately within the range of 160 to 200 nm.

An apparatus comprising organic devices having a non-common capping layer is also provided. A first apparatus comprises a plurality of OLEDs, each OLED having a first electrode, a second electrode disposed over the first electrode; and an organic electroluminescent (EL) material disposed between the first and die second electrodes. The first apparatus further includes a first capping layer that is disposed over the second electrode of at least a first portion of the plurality of OLEDs such that the first capping layer is optically coupled to at least the first portion of the plurality of OLEDs. The first apparatus also comprises a second capping layer. The second capping layer may be disposed over the second electrode of at least a second portion of the plurality of OLEDs such that the second capping layer is optically coupled to the second portion of the plurality of OLEDs but not the first portion of the plurality of OLEDs. In some embodiments, the second capping layer was not deposited through a FMM. In some embodiments, the plurality of OLEDs comprise a plurality of red OLEDs, a plurality of blue OLEDs, and a plurality of green OLEDs.

In some embodiments, in the first apparatus as described above where the plurality of OLEDs comprise a plurality of red OLEDs, a plurality of blue OLEDs, and a plurality of green OLEDs, the second capping layer is not disposed over at least one of the plurality of red OLEDs, green OLEDs, and blue OLEDs. In some embodiments, the second capping layer is not disposed over the plurality of blue OLEDs.

In some embodiments, in the first apparatus as described above where the plurality of OLEDs comprise a plurality of red OLEDs, a plurality of blue OLEDs, and a plurality of green OLEDs, and where the plurality of OLEDs further comprise a third portion of OLEDs that is different from the first and second portions, the first apparatus further comprises a third capping layer disposed over the second electrode of at least the third portion of the plurality of OLEDs such that the third capping layer is optically coupled to at least the third portion of the plurality of OLEDs. In some embodiments, the third capping layer is not optically coupled to the first or the second portions of the plurality of OLEDs. In some embodiments, the third capping layer was not deposited through a FMM or by VTE. In some embodiments, the second capping layer is not optically coupled to the plurality of blue OLEDs or the plurality of green OLEDs and the third capping layer is not optically coupled to the plurality of red OLEDs or the plurality of blue OLEDs.

In general the addition of a capping layer enhances the efficiency of top emission organic light emitting devices. The optimal optical thickness of a capping layer depends on the emission color (i.e. the wavelength of the light emissions). For example, the optimal optical thickness of the capping layer is different for red, green, and blue light emissions. However, based in part on the complexities in the manufacturing process, as well as the increased expense of performing multiple deposition steps, the solution developed thus far by manufacturers is to compromise and choose a single thickness for the capping layer of a device that is tailored to the 'weakest' color (usually blue). This results in less than optimal efficiency for the other colors (usually the red and green OLEDs). Thus, provided herein is a device, and method of manufacturing such a device, that addresses these deficiencies by utilizing capping layers having a different optical thickness for each color OLED. This allows for the optimization of the efficiency of each of the OLEDs, regardless of their light emission color.

Embodiments provided herein also utilize deposition techniques that do not require the use of a fine metal mask (FMM) or other costly deposition processes that may otherwise be cost prohibitive of depositing multiple capping layers for a single device. For instance, embodiments provide for the use of LITI and/or LIPS deposition techniques, which thus far have not been recognized as a readily viable technique for depositing capping layers. To date both of these exemplary techniques have been used only at research and development levels with respect to OLEDs, and further have only been used in an attempt to deposit the electrically active elements of the OLED stack. However, the inventors have recognized that, based in part on the fact that the capping layers are not electrically active, many of the deficiencies of such techniques are minimized, making them effective for depositing capping layers having different optical thicknesses for each color OLED.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole, pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
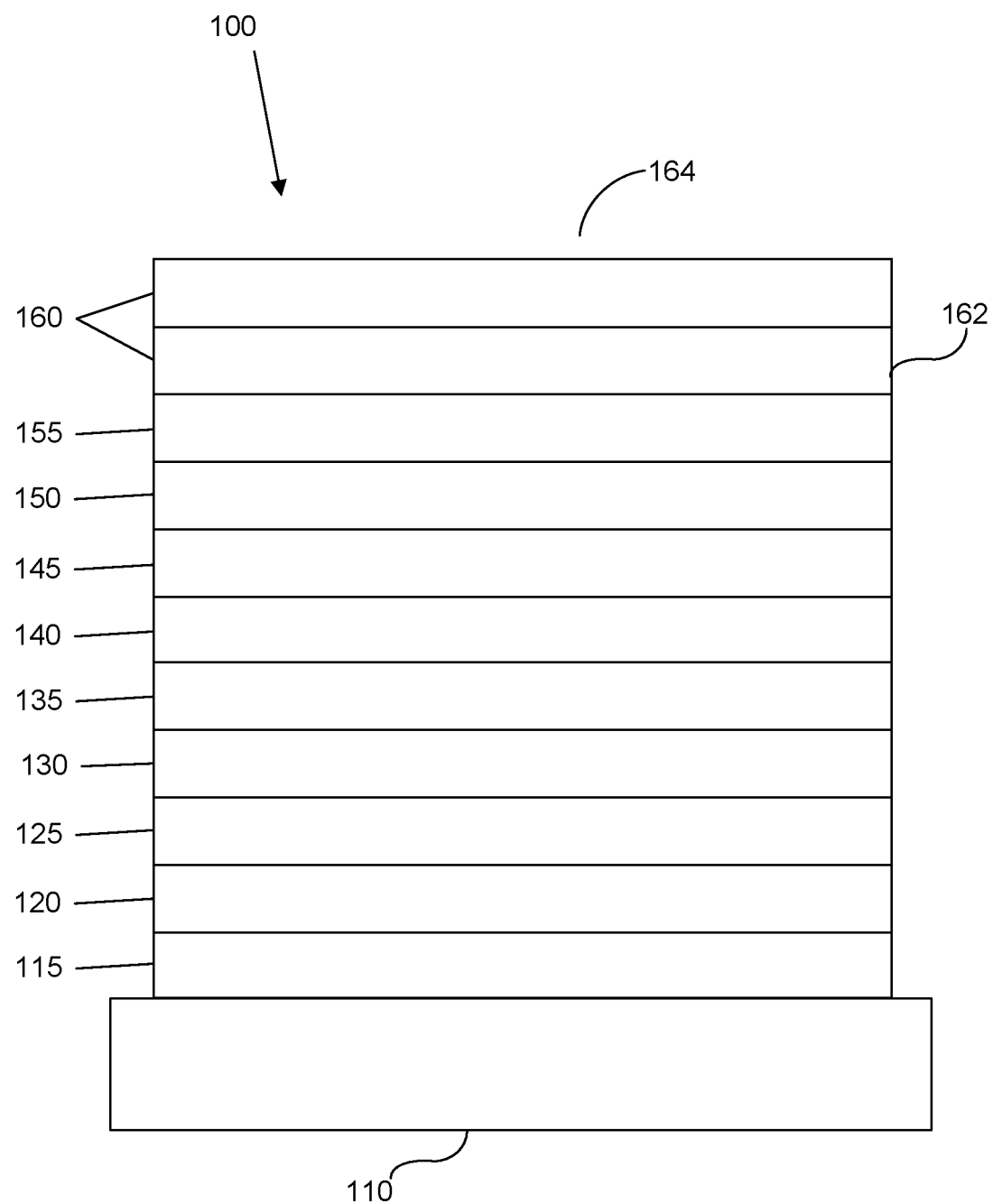
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO Layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
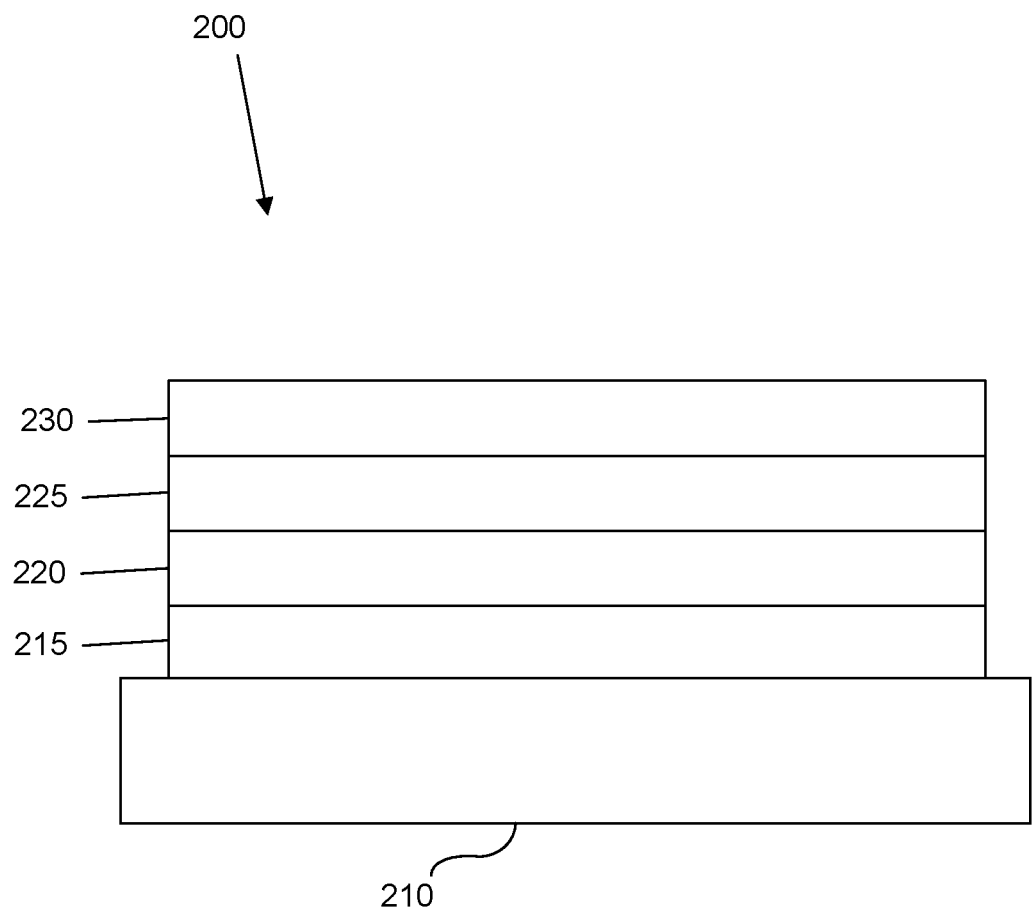
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are Incorporated by reference in their entireties, and patterning associated with some of the deposition methods such as ink-jet and OVJD. Other methods may also be used. The materials to be deposited may be modified, to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, the term "capping layer" may refer to a layer of material that is deposited over the top electrode of an OLED (which is typically the cathode for top emission devices). The layer is typically used to enhance the amount of light outcoupled from the OLED. The layer may be made of any suitable material (such as $Alq_3$), and is preferably transparent, semi-transparent, or translucent. The term "total capping layer" may refer to the combination of all of the capping layers disposed over (and optically coupled to) an OLED. For instance, if a first and second capping layer are disposed over an OLED such that they are all optically coupled, the total capping layer of the OLED is the combination of the first and second capping layers. The "total optical thickness" is the optical thickness of the total capping layer.

As used herein, the term "optically coupled" may refer to a configuration in which substantially all of the light that is emitted from, or that propagates through, a surface of a first component also propagates through a substantially parallel surface of a second component. A "component" may include an organic device (e.g. OLED, transparent OLED, or top-emission OLED), a layer of an organic device (such as an organic layer, an emitting layer, etc.), a capping layer (which may be disposed over an organic device), a substrate, and/or an electrode of an organic device. For example, an OLED may be optically coupled to a capping layer if substantially all of the light that is emitted from the OLED in a direction perpendicular to one of its electrodes also propagates through a surface of a capping layer that is substantially parallel to the electrode.

As used herein, the term "deposit" or "depositing" includes any known method of fabricating a layer of an organic device on a first substrate, including VTE, OVJP, OVJD, stamping, ink jet deposition, LITI, LIPS, as well as fabrication (including photolithography) of a layer on a second substrate followed by alignment of the first and second substrates. Stamping (both additive (i.e. cold welding) and subtractive) is described in detail in U.S. Pat. Nos. 6,294,398, 6,895,667 and 7,964,439 each of which is hereby incorporated by reference.

As used herein, a capping layer may be "common" to a plurality of organic devices if it is disposed over (e.g. covering) a substantial portion of each of the plurality of OLEDs. For instance, if a capping layer is common to a first and a second OLED, but is not common to a third OLED, then the capping layer will be disposed over a substantial portion of both the first and second OLED, but will not be substantially disposed over the third OLED.

As used herein, the term "blanket layer" may refer to a layer that is common to all of, or substantially all of, the OLEDs on a substrate. A blanket layer may be deposited through a mask that prevents material from depositing around the edges of the substrate (for example, in the area required for encapsulation or in areas requiring electrical contact from an external power supply or video signal). However, the deposition of a blanket layer generally does not involve deposition of materials onto the substrate through a mask that defines features on the substrate (such as individual pixels of one particular color), such as an FMM. In most cases, the mask used does not need to be aligned to a degree of precision that exactly matches the deposition holes with sub-pixel size features on the substrate.

As used herein a "patterned mask" or "fine metal mask" (FMM) may refer to masks that may be used to deposit materials onto a substrate. For VTE, usually the organic and metal layers are deposited through a "patterned mask" including blanket and/or common layers. Thus, the opening (i.e. "hole") in a "patterned mask" is usually large and covers a significant portion of the display or lighting panel area. In contrast, an FMM may be used to deposit features having a pattern resolution smaller than the entire active (light emitting) area of the substrate. Typically, an FMM has one dimension that is of the order of the dimensions of a portion of the sub-pixels (usually of one color) that is disposed on the substrate. An FMM is thereby typically utilized for the deposition of the emissive layer of an organic device, where the differing colors of the display are each deposited separately through an FMM designed to only allow deposition on a portion of the active OLEDs present in the display (e.g. an FMM through which only the red emissive layer is deposited, another FMM through which only the green emissive layer is deposited, etc.).

All masks whether "patterned" (such as those with a large opening for common deposition) or an FMM require some degree of alignment. However the FMM requires a far tighter alignment tolerance (e.g. on the order of the dimension of a portion of the sub-pixels) and thereby usually takes longer to align, which may add significantly to the time and cost of manufacturing. FMMs also typically require more regular maintenance (i.e. replacement or regular cleaning) than large area "patterned" masks, as the smaller "holes" in the FMM (through which material is deposited) can reduce in size as a junction of deposition/production time as material is deposited onto them. This can cause problems in the display area as the deposition area of the FMM is reduced beyond its original design. Moreover, a build up of material on an FMM can also cause issues related to "flaking" (i.e. material falling off the mask into the chamber or getting onto the substrate), which may create yield problems. These issues may not be as significant for a "patterned, large area mask, as the surface area of the mask onto which material can be deposited is far smaller (i.e. there are larger openings for material to be deposited through).

As used herein the term "optical thickness" may refer to the product of the physical thickness of an isotropic optical element and its refractive index. The "physical thickness" of a capping layer refers to the length of the capping layer in a direction that is substantially perpendicular to the surface of the substrate that an OLED is disposed over.

As used herein, the term "optimized" or "optimal" may refer to maximizing the lifetime or efficiency of an OLED, which may result from reducing the loss of efficiency to less than approximately 5%.

Typically in top emission (or transparent) organic devices, a capping layer is deposited, onto the top electrode to enhance the emission from the device. That is, a capping layer (which, typically includes high, transparency materials) is employed to limit attenuation of the light emitted from a device. If the capping layer is chosen properly, the capping layer can enhance the output, of a top-emitting device by, for instance, increasing the luminance by reducing the outcoupling losses from the device due to processes such as internal waveguiding. However, the optimal, thickness (in terms of efficiency) of a capping layer made of a given material differs depending on the light emission color (and thereby the wavelength of the light). This is due to the difference in the wavelength of the different color light emissions and the corresponding effects of interference patterns (both wide angle and multiple beam interference) created in the OLEDs. The effect of the thickness of a capping layer on light transmission from a top-emitting OLED is described in detail in the following references, which are hereby incorporated in there entireties for all purposes:

H. Riel, S. Karg, T. Beierlein, R. Ruhstaller, and W. Rieβ "Phosphorescent Top-Emitting Organic Light-Emitting Devices With Improved Light Outcoupling," *Applied Physics Letters*, Vol. 82, No. 3 (Jan. 20, 2003).

H. Riel, S. Karg, T. Beierlein, B. Ruhstaller, and W. Rieβ, "Tuning the Emission Characteristics of Top-Emitting Organic Light-Emitting Devices By Means of a Dielectric Capping Layer: An Experimental and Theoretical Study," *Journal of Applied Physics*, Vol. 94, No. 8 (Oct. 15, 2003).

The inventors have recognized that one way to achieve maximum efficiency for a device comprising a plurality of OLEDs emitting light of different wavelengths is to have different capping layers for each of the organic devices. For example, for a side-by-side red-green-blue (RGB) display, embodiments provided herein may utilize different optical thicknesses of the capping layer for each of the RGB pixels (e.g. a first capping layer optical thickness disposed over the blue pixels, a second capping layer optical thickness disposed over the green pixels, and a third capping layer optical thickness disposed over the red pixels). In some embodiments, rather than or in addition to varying the physical thickness of the capping layer, different materials may be used for the different capping layers for each of the different colored OLEDs to achieve a similar optimization (which may thereby vary the optical thickness of the capping layer based on the index of refraction of the materials). Although described with respect to an RGB display, it should be understood that embodiments are not so limited, and may provide for different capping layer thicknesses (and/or materials) for each color OLED in any given device.

However, providing different capping layer physical thicknesses and/or materials for each of the OLED devices (i.e. for each of the colors emitted) can add to the cost and complexity of the manufacturing process for a device or apparatus (such as a display) that comprises multiple colored OLED devices. Moreover, additional manufacturing steps create more opportunities for errors in the manufacturing process to occur. Therefore, the solution developed by manufacturers typically compromises choosing a single thickness and material for a capping layer that is tailored to the 'weakest' color (usually blue). By 'weakest' color, what is meant is the color for which the OLEDs are least efficient or shortest lived. This use of only a single capping layer results in less than optimal performance for the OLEDs that emit light having a different wavelength than the one for which the capping layer thickness is optimized. Typically, this is the red and green organic devices when the capping layer is chosen to maximize the blue OLEDs. For instance, using a less than optimal capping layer (e.g. a capping layer optimized for blue light emissions) may result in a loss of approximately 5-10% in potential green efficiency and/or a loss of approximately 30% in potential for red efficiency. By 'potential efficiency,' it is meant the efficiency of a device if the capping layer is chosen to optimize its efficiency. Therefore, the device as whole does not operate as efficiently as possible.

Embodiments provided herein disclose devices (such as displays) that have the light emissions of each OLED optimized by utilizing a total capping layer for each organic device that has an optical thickness that is different for each color light emission (e.g. by providing different thicknesses and/or materials as needed). The effects of the interference patterns created in such top-emissions devices are dictated in part by the optical thickness of the capping layer and the wavelength of the light emissions and can thereby be minimized. Despite the understanding in the art that the thickness of the capping layer may effect the optical efficiency of OLEDs, there has been no recognition of this solution, which provides a novel approach, for devices having a plurality of OLEDs emitting multiple colors (e.g. a red, green, and blue display). Indeed, within the industry such a solution is taught away from because of the notion that it would be impractical and/or not cost effective to manufacture such a device. However, as detailed below, the inventors herein have provided embodiments of devices and methods of manufacturing such embodiments that may satisfy some or all of these concerns.

As noted above, achieving optimization of light emission for each color OLED in a device by utilizing capping layers having different optical thicknesses could substantially increase the cost of manufacturing such devices using traditional processes. That is, providing different capping layer thicknesses or materials could require the use of multiple deposition processes or steps. For instance, using traditional approaches may require the use of multiple patterned masks (e.g. FMMs in combination with VTE deposition through the FMM) for depositing each of the different materials and/or different thicknesses of the same material over each OLED color. A typical ROB device (that is, a device complising OLEDs having one of three different colors) would typically involve two additional fine deposition steps, each requiring the use of an FNM.

However, each time a process requires the use of an additional deposition step (particularly through an FMM), the costs in both time and expense of fabrication increases. For example, each iteration may require that a patterned mask (and in particular, an FMM) be properly aligned prior to depositing additional materials to a device. As noted above, FMMs often require a tight alignment tolerance and thereby usually take a relatively long time to align properly. Moreover, FMMs often have high costs associated with their continued use-typically requiring regular maintenance (i.e. replacement or regular cleaning) as the small "holes" in the mask can reduce in size as a function of deposition and/or production time as material is deposited onto the mask.

Furthermore, utilizing FMMs often increases the chances of certain defects occurring in the manufacturing process, such as issues related to the reduction of the area that is deposited through the mask (based on the increase of material deposited in the "holes" of the mask) thereby causing problems in the lighting or display area. A build up of material on an FMM can also cause issues due to "flaking"—i.e. material falling off the mask into the chamber or getting onto the substrate, which may induce yield problems. Therefore, the inventors have further recognized the preference of utilizing alternative deposition techniques to depositing multiple capping layers.

Embodiments provided herein allow for the use of a different capping layer optical thickness for each pixel and/or color OLED (thereby enabling optimization of the output efficiency of each of the OLEDs of a device), without requiring the additional steps of performing deposition using a FMM. In an exemplary embodiment, for instance, red, green, and blue OLEDs may be fabricated utilizing known techniques including a common capping layer (e.g. a capping layer that may be common to multiple pixels that are different colors). This capping layer may be designed so as to match (i.e. optimize) the blue pixel, as typically this pixel may also require the smallest thickness of material. The additional capping layer material needed to optimize the red and green pixels may then be deposited so as to be optically coupled with each pixel. However, application of the additional material may not be done using a FMM and/or VTE deposition of the material. Instead, embodiments provided herein may deposit the additional material using, for example, laser induced thermal imaging (LITI) and/or laser induced pattern-wise sublimation (LIPS) deposition onto the common capping layer.

In brief and by not way limiting, some examples of LITI processes utilize a donor film (donor), a highly accurate laser exposure system, and a substrate (receptor). The donor film may first be laminated onto the substrate using any known method such that the donor and receptor are in intimate contact. The donor may comprise a light-to-heat conversion (LTHC) layer that converts laser energy to heat. The LTHC layer comprises material that absorbs the wavelength of irradiation and converts a portion of the incident radiation into sufficient heat to enable the transfer of a thermal transfer layer (typically organic materials) from the donor to the receptor. The donor is then exposed (in an image wise pattern) with a laser beam from the highly accurate laser exposure system, which is absorbed by the LTHC layer. This results in the release of the thermal transfer layer from the donor, as well as the adhesion of the thermal transfer layer to the receptor. After the transfer of all the desired materials is complete, the donor is peeled away from the receptor interface. In this manner, only the exposed region of the donor transfers materials to the receptor. However, it should he understood that there may be other LITI processes that utilize similar method and principles, and this description is not meant to be limiting.

Further examples and details of LITI processes are described in the following references, each of which is incorporated by reference in their entireties and for all purposes:

S T Lee, J Y Lee, M H Kim, M C Suh, T M Kang, Y J Choi, J Y Park, J H Kwon, H K Chung, "A New Patterning Method for Full-Color Polymer Light-Emitting Devices: Laser Induced Thermal Imaging (LITI)," *Proceedings of the Society for Information Display*, Digest of Technical Papers 33:(suppl2), Boston, 2002, pp 784-787.

S T Lee, B D Chin, M H Kim, T M Kang, M W Song, J H Lee, H D Kim, H K Chung, M B Wolk, E Bellman, J P Baetzold, S Lamansky, V Savvateev, T R Hoffend, J S Staral, R R Roberts, Y Li. A novel patterning method for full-color organic light-emitting devices: laser induced thermal imaging (LITI). *Proceedings of the Society for Information Display*, Digest of Technical Papers 35:(suppl2), Seattle, 2004, pp 1008-1011.

LIPS processes may be similar to LITI processes with the exception that the donor and receptor may first be put together in a vacuum, and fixed with a clamping mechanism. The donor, receptor, and clamping mechanism are then removed from the vacuum (and are held together by atmospheric pressure applied to either substrate), while a gap between the pixels may be maintained by the height of a pixel defined layer (PDL). A laser is then used to heat the desired portions of the donor (e.g. glass substrate having donor materials) such that the donor materials are transferred to the receptor by vacuum sublimation. An example of a LIPS process is described in the following reference, which is incorporated by reference in its entirety and for all purposes:

T Hirano, K Matsuda, K Kohinata, K Hanawa, T Matsumi, E Matsuda, T Ishibashi, A Yoshida, T Sasaoka, "Novel Laser Transfer Technology for Manufacturing Large-Sized Displays, *Proceedings of the Society for Information Display*, Digest of Technical Papers 38: (suppl2), Long Beach, 2007, pp 1592-1595.

LITI and LIPS processes have certain disadvantages that typically make them less than ideal, particularly for deposition of materials that have electro-active properties. For instance, in LITI processes, contact between the donor film and any emitting layer can degrade the device; the transferred layer interface is formed by a lamination process, which may also degrade a device; and the process may be highly sensitive to particle contamination, which may disrupt electrical contacts (although this may be reduced by the LIPS process by the creation of a vacuum between the donor and the substrate). Both deposition techniques also require the application of very high power density energy. Such application can cause thermal degradation of the materials or require additional constraints on the thermal properties of the materials being deposited (e.g. Tg, sublimation temperature range, etc.). These constraints limit the choice of material that can be used in the electro-active components.

However, unlike the deposition of the organic layers that LITI and LIPS processes have thus far been utilized to deposit, capping layer materials are not electrically active components in the OLED device. The inventors have recognized thereby that concerns and complications typically related to the LITI process and its deleterious effect from a lifetime perspective are reduced when using this process for depositing additional capping layer thicknesses and materials. Moreover, in some embodiments, the LITI process could also be potentially performed in a glovebox or in air. Such a process would likely be far less costly than the FMM/VTE approach to depositing optimized capping layers for each OLED. For example, neither LITI nor LIPS requires the use of a mask, making it highly adaptable as there is no need for retooling if a design is changed. Moreover, the use of laser deposition techniques can be highly precise, and do not require the alignment of masks to deposit materials. Furthermore, and as discussed below, if the capping layer is not deposited by VTE through an FMM, then it can be done offline (i.e. separate from an in-line manufacturing process) and thereby simplify the manufacturing process. This is due in part because the materials would not be directly deposited onto the substrate that comprises the organic material, which are often less tolerant to manufacturing and deposition conditions (such as heat).

For instance, in some embodiments the capping layer or capping layers may not be deposited directly onto the organic devices. Instead, the capping layer material may be deposited onto a second substrate, such as a display cover glass. In some embodiments, for an RGB display, this may be the capping layer material for optimizing only red OLEDs. This patterning can be done using a variety of deposition methods including photolithography, LITI, LIPS, stamping, or inkjet printing as the capping layer is not an electrically active component in the device and therefore concerns over damage during deposition are lessened. Continuing with the RGB display example, the red capping layer material may be deposited in such a way as to enable it to be aligned with the corresponding red sub pixel pattern on the display backplane. When the cover glass and backplane are then mated (i.e. coupled) together the red capping layer would then be optically coupled to a common capping layer (which may in some embodiments be deposited as a blanket layer—e.g. not through an FMM) over the red sub pixels enabling the common capping layer and red capping layer to be optically coupled to the red sub pixels.

In general, because the blue pixel is the usual candidate for the optimized capping layer (i.e. when only a single uniform capping layer is provided), in some embodiments the red pixel is the color that usually is most disadvantaged in terms of efficiency. Therefore, in some embodiments, for the fabrication methods described above, the most important color (after blue) may be the red pixel from an optimization perspective. Therefore it may be possible to only apply the additional capping layer material to the red sub-pixels (assuming there is already a common capping layer—i.e. that the capping layer is common to a plurality of OLEDs that is designed to optimize the blue OLEDs) in order to simplify the fabrication process, while achieving an increase in performance of the device. Thus, in such, embodiments, there may be only two different capping layers: a first capping layer that is common to all of the OLEDs (i.e. the red, blue, and green OLEDs) and a second capping layer that is optically coupled to only the red OLEDs. However, as described below, embodiments are not so limited and this Is merely for illustration, purposes.

Exemplary Embodiments, of Methods

Described below are exemplary embodiments of devices, and exemplary methods of manufacturing devices, comprising organic devices and different capping layers (i.e. non-common). The embodiments are described for illustration purposes only and are not thereby intended to be limiting. After reading this disclosure, it may be apparent to a person of ordinary skill that various component's as described below may be combined or omitted in certain embodiments, while still practicing the principles described.

Moreover, it should be understood that while the discussion provided herein discloses various embodiments of devices, and methods of manufacturing such devices that generally comprise a non-common capping layer (or layers) without requiring a specific manner in which the non-common capping layer (or layers) was deposited, it is generally preferred that the non-common capping layers are not deposited through an FMM. Such preferred deposition techniques may comprise utilizing other methods such as, for example, LIPS, LITI, or deposition onto a second substrate and alignment (as described below). Therefore, the disclosure below should be understood as describing various embodiments comprising capping layers disposed using any known method, but also as embodiments comprising the same features as those devices but preferably comprising a non-common capping layer (or layers) that are not deposited through the use of an FMM.

A method for fabricating an organic device having a non-common capping layer is provided. A first method comprises providing a plurality of OLEDs on a first substrate. "Providing" may comprise any known manner of obtaining a substrate having a desired number and type of organic devices disposed thereon. This includes, by way of example, depositing the OLEDs on the substrate using any known technique, including those described above. Moreover, embodiments also comprise purchasing or otherwise obtaining a substrate that already has some or all of the OLEDs (or components thereof) disposed thereon. In cases where only some of the components are provided on a substrate, it is also envisioned that "providing" encompasses completing the components (e.g. by depositing additional layers of materials) of the OLEDs on the substrate.

Each of the plurality of OLEDs includes a transmissive top electrode. That is, the top electrode may be transparent, semi-transparent, or translucent such that light may propagate through the top electrode. In some embodiments, the OLED may be a transparent OLED or a top-emission OLED. Top-emitting OLEDs are often better suited for active-matrix applications because, for instance, they may be more easily integrated with a non-transparent transistor backplane. This is often the case for displays.

The plurality of OLEDs includes a first portion of OLEDs and a second portion of OLEDs that is different from the first portion. That is, the OLEDs that comprise the first portion are separate and distinct from the OLEDs that comprise the second portion such that there is no overlap between these two designations. In some embodiments, the first portion may comprise only OLEDs that emit a single color. In some embodiments, the first portion and the second portion of OLEDs do not comprise any overlap in OLEDs that emit a single color. That is, for instance, a red OLED will not be included in both the first portion and the second portion of the plurality of OLEDs.

The first method further includes depositing a first capping layer over at least the first portion of the plurality of OLEDs such that the first capping layer is optically coupled to at least the first portion of the plurality of OLEDs. As described above, the capping layer is often used in top emission organic devices to decrease the absorption and interference loses created by the transparent conductor and the reflectivity of the bottom electrode. The capping layer may comprise any suitable material, and may comprise a dielectric material. In some embodiments, the capping layer is preferably $Alq_3$. The first capping layer may be deposited using any suitable method, including those described above.

The first method also comprises depositing a second capping layer over at least the second portion of the plurality of OLEDs such that the second capping layer is optically coupled to the second portion of the plurality of OLEDs but not the first portion of the plurality of OLEDs. That is, in some embodiments, the second capping layer is deposited so that it is disposed over the second portion of the plurality of OLEDs, but not the first portion so that the optical thickness of the total capping layer over the first portion and the second portion of the plurality of OLEDs may be different. As defined above, the total capping layer may refer to the combination of each of the capping layers disposed over an OLED for instance, if the first and second capping layer are both optically coupled to the second portion of the plurality of OLEDs, then the total capping layer is the combination of the first and second capping layer. This is illustrated in the various embodiments shown in FIGS. 3 and 5-9, which are described below. Preferably, the second capping layer, as noted above, be deposited using a method that does not utilize an FMM, for the reasons noted.

The first method and resulting device described above may provide advantages over current devices. For instance, by providing a first and a second capping layer, the device may optimize the emissions from at least two different color emitting OLEDs. For instance, current devices (such a displays comprising OLEDs) only utilize a single capping layer that is common across all of the organic devices, regardless of the wavelength of the light emission from each device. The result is that while the OLEDs that emit light having one color may be optimized, the other organic devices are not effectively out coupled so as to provide maximum efficiency. It should be noted that the effect of the optical thickness on different light emissions was described above, particularly in H. Riel, et al "Phosphorescent Top-Emitting Organic Light-Emitting Devices With Improved Light Outcoupling," and "Tuning the Emission Characteristics of Top-Emitting Organic Light-Emitting Devices By Means of a Dielectric Capping Layer: An Experimental and Theoretical Study." Moreover, the effectiveness of having multiple capping layers that are optimized for the different wavelength emissions (i.e. having different optical thicknesses) is demonstrated below in the experimental simulations section.

In some embodiments, in the first method as described above in which a plurality of OLEDs are provided on a substrate and a first and second capping layer are deposited so as to be optically coupled to a first and second portion of the OLEDs, respectively, the second capping layer is not deposited through a patterned mask or, preferably, through an FMM. As described above, additional deposition steps using FMMs may increase expense and time to manufacture organic devices. By utilizing alternative methods, as discussed below, embodiments may provide methods that are more cost effective, flexible, and time efficient. Furthermore, these alternative deposition methods have not been utilized in applying capping layers to top emission devices (let alone non-common capping layers having different optical thicknesses). The inventors have recognized that such techniques, while having limitations that may make them less than ideal when depositing electrically active components, do not present some or all of those deficiencies with regard to capping layers because the capping layers are not electrically active (they may comprise dielectric materials). In this regard, in some embodiments, the second capping layer is deposited using at least one of: laser induced thermal imaging (LITI) or laser induced pattern-wise sublimation (LIPS). While these exemplary deposition techniques may require the application of very high power density energy and may thereby cause thermal degradation of the materials or require additional constraints on the thermal properties (as described above) making them not preferable for depositing electro-active components, these same deficiencies are reduced when, applying non-electro-active layers. However, in some embodiments, any deposition technique that does not involve the use of an FMM or similar technique may be used.

In some embodiments, the first method as described above further includes depositing the first capping layer over at least the second portion of the plurality of OLEDs such that the first capping layer is optically coupled to the second portion of the plurality of OLEDs. This is illustrated in the exemplary embodiments shown in FIGS. 3 and 7-9. For instance, in some embodiments, the first capping layer may be optically coupled to OLEDs that emit light in different colors, whereas the second capping layer may be optically coupled to OLEDs that emit light of a single color. However, embodiments may not be so limited. In some embodiments, the first capping layer is optically coupled to at least one color of OLEDs that the second capping layer is not optically coupled to. For example, in some embodiments, the first capping layer may be optically coupled to a plurality of blue, green, and red OLEDs, whereas the second capping layer may be optically coupled to only a plurality of red or green (or both) OLEDs.

In this regard, in some embodiments, the first capping layer may comprise a blanket layer. That is, the first capping layer may be deposited so as to be disposed over all, or substantially all, of the OLEDs on a substrate of a device such that it is common to each of the OLEDs. This may have the advantage that the first capping layer need not be deposited through a FMM or other expensive and/or complex deposition process. The optical thickness of the first capping layer may be selected so as to optimize the OLEDs that emit light of a particular color. In some embodiments, the optical thickness of the first capping layer may be selected so as to correspond to the smallest thickness that optimizes at least one of the OLED emission colors. In this manner, additional capping layers may be disposed over the first capping layer so that the total capping layer that is optically coupled to OLEDs having a different color are also optimized (i.e. the optical thickness is optimized for light emissions having a particular wavelength).

Figure 4:
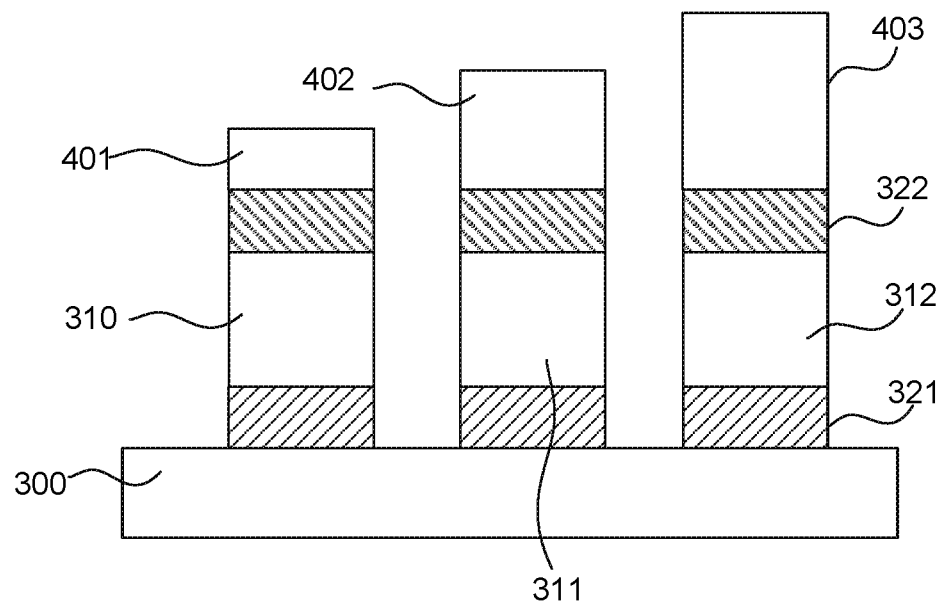
FIG. 4 illustrates a side view of an exemplary device in accordance with embodiments described herein.

In some embodiments, the first capping layer is not deposited over the second portion of the plurality of OLEDs such that the first capping layer is not optically coupled to the second portion of the plurality of OLEDs. An exemplary embodiment of this is shown in FIG. 4, whereby none of the optical layers are common across OLEDs of different colors. In some embodiments, in the first method described above, the plurality of OLEDs are transparent OLEDs and/or are top emission OLEDs. Again, top emission OLEDs may be better suited for certain implementations, such as displays.

In some embodiments, in the first method described above, the first capping layer has a first total optical path that is constant over the first portion of the plurality of OLEDs, the second capping layer may comprise a second total optical path that is constant over the second portion of the plurality of OLEDs, and the first total optical path and the second total optical path are different. This may be the case in some embodiments when the plurality of OLEDs comprise OLEDs that emit light of different wavelength, and thereby the optical thickness that maximizes the efficiencies of the OLEDs is also different. Thus, embodiments that provide two different optical thickness may be capable of maximizing two different color OLEDs.

Figure 8:
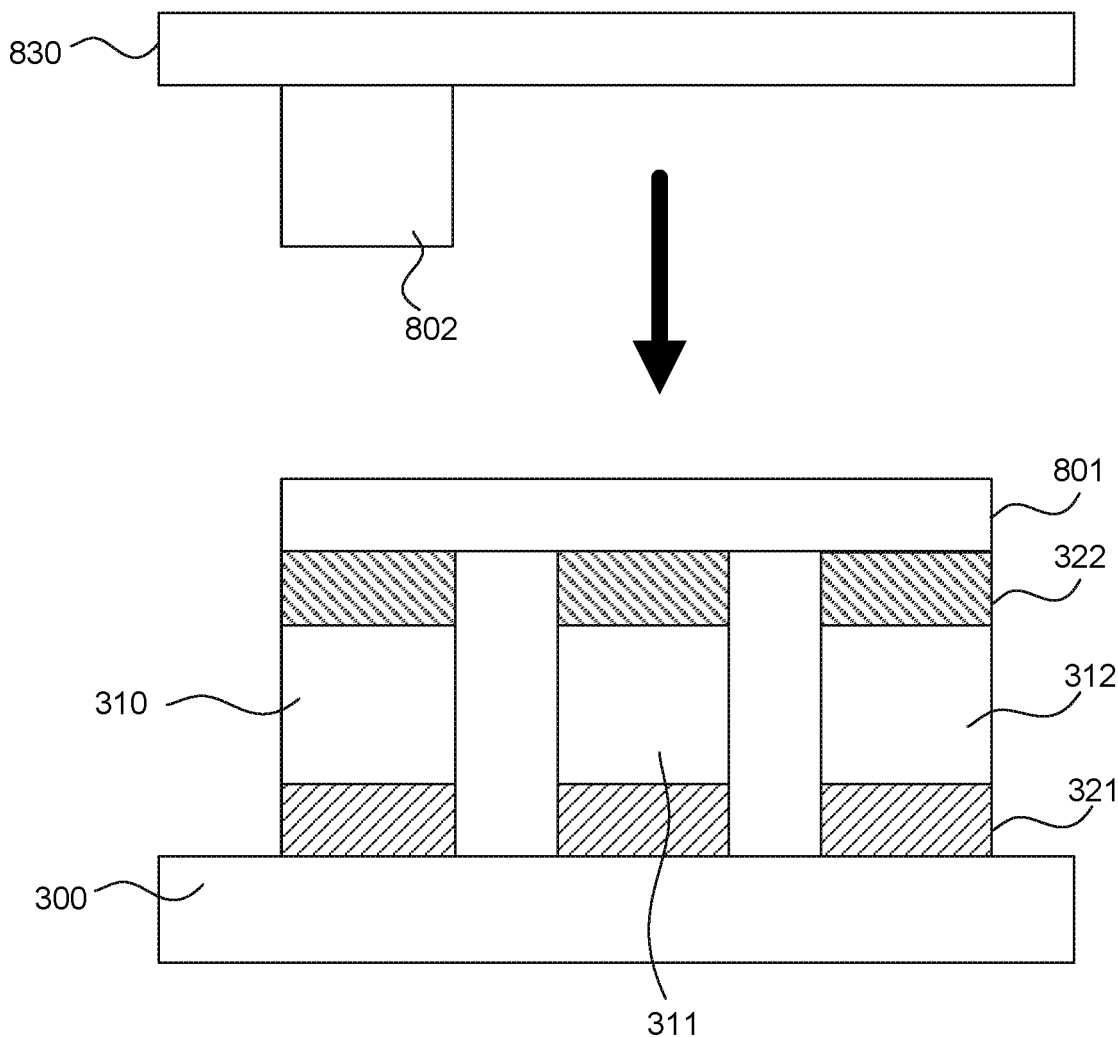
FIG. 8 illustrates a side view of an exemplary device in accordance with embodiments described herein.
Figure 9:
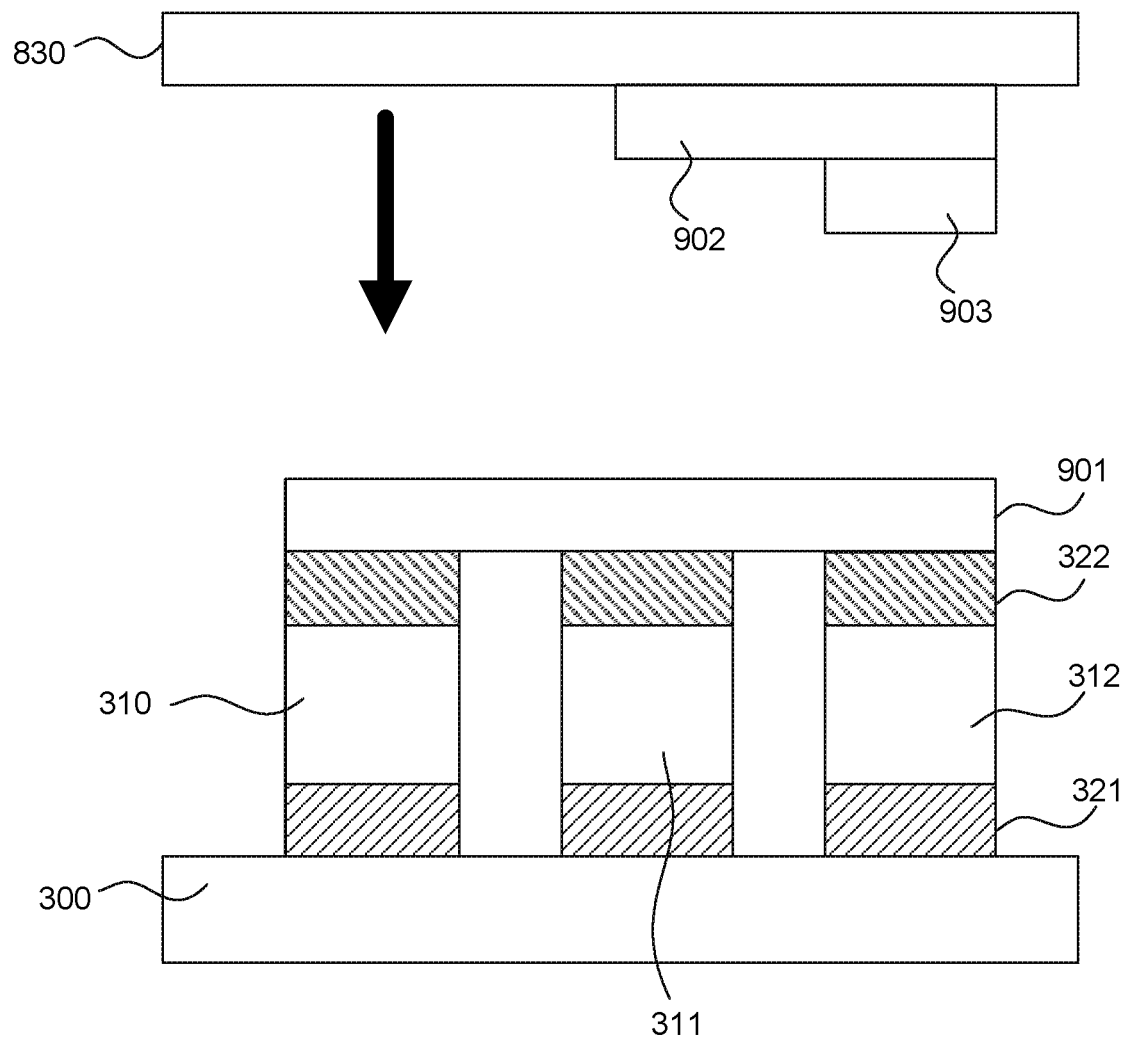
FIG. 9 illustrates a side view of an exemplary device in accordance with embodiments described herein.

In some embodiments, in the first method as described above in which a plurality of OLEDs are provided on a substrate and a first and second capping layer are deposited so as to be optically coupled to a first and second portion of the OLEDs, respectively, the step of depositing the second capping layer may comprise depositing the second capping layer onto portions of a second substrate and aligning the second capping layer over at least the second portion of the plurality of OLEDs. This is illustrated in FIGS. 8-9, and will be described in more detail below. Embodiments may permit deposition using any known technique, such as using at least one of: photolithography, LITI, LIPS, stamping, or inkjet printing. Depositing the second capping layer on a second substrate may be less expensive and complex compared to deposition of the capping layers directly over the OLEDs (e.g. depositing the capping layers directly over the same substrate as the OLEDs) because, for instance, the deposition on the second substrate may be done without the risk of damaging the organic materials (which may be relatively sensitive to damage from other deposition and manufacturing processes). Moreover, if a manufacturing error was to occur in this deposition process, it would not be as costly as there are no other OLED materials disposed on the second substrate.

Continuing with the exemplary embodiment whereby the second capping layer is deposited on a second substrate, in some embodiments, the step of aligning the second capping layer over at least the second portion of the plurality of OLEDs comprises depositing the second capping layer onto portions of the second substrate such that the second capping layer is over at least the second portion of the plurality of OLEDs when the second substrate is coupled to the first substrate. That is, for example, the second capping layer may be optically coupled to the second portion of the plurality of OLEDs when the first and second substrates are coupled. In this manner, a device (such as a display) may comprise multiple capping layers having different optical thicknesses that each optimize OLEDs having light emissions of different wavelengths—while not requiring direct deposition of the second capping layer over the OLEDs and/or the first capping layer. Moreover, in some embodiments, the first capping layer is optically coupled to the second capping layer when the first substrate is coupled to the second substrate. This may be the case, for instance, when the first capping layer is common to a plurality of OLEDs that emit light in different colors.

Continuing with the exemplary embodiment whereby the second capping layer is deposited on a second substrate, in some embodiments, the second substrate is a display cover. Moreover, in such embodiments, the coupling of the first and the second substrates can serve to encapsulate the organic devices. In this regard, materials in an OLED are sensitive to air and moisture, which can lead to degradation of the organic materials and/or quenching of excited states within the molecules if they are exposed to such atmospheric conditions. Utilizing the second substrate (which may comprise glass) in this manner can thereby serve multiple purposes.

In some embodiments, in the first method as described above in which a plurality of OLEDs are provided on a substrate and a first and second capping layer are deposited so as to be optically coupled to a first and second portion of the OLEDs, respectively, depositing the first capping layer may comprise either one of, or some combination of: FMM and VTE. This may be the case when the first capping layer is not common to all, or substantially all, of the OLED devices on the first substrate. In some embodiments, none of the capping layers are deposited by either one of, or some combination of: FMM and VTE. For example, in some embodiments, all of the capping layers may be deposited using LITI or LISP processes, which provide the advantages described above over traditional deposition processes. In this manner, embodiments may provide the advantage of not using an FMM, which can add to the complexity of manufacturing OLEDs, and also introduces various sources of error such as mask deformation.

In some embodiments, in the first method as described above in which a plurality of OLEDs are provided on a substrate and a first and second capping layer are deposited so as to be optically coupled to a first and second portion of the OLEDs, respectively, the plurality of OLEDs may include a plurality of red OLEDs, a plurality of green OLEDs, and a plurality of blue OLEDs. This is typically the case for most displays (and light panels), as most colors can be replicated by using the combination of red, green, and blue light, including white light. Moreover, the first and second portions of the plurality of OLEDs may each comprise OLEDs of particular colors, and in some embodiments there may not be any overlap. For instance, in some embodiments, the first portion of the plurality of OLEDs may comprise a plurality of blue OLEDs and/or the second portion of the plurality of OLEDs may comprise only a plurality of the green OLEDs and a plurality of the red OLEDs. It follows thereby that in some embodiments, the first capping layer (which is optically coupled to the first portion of the plurality of OLEDs—i.e. the blue OLEDs) may be different than the second capping layer (which is optically coupled to the second portion of the plurality of OLEDs—i.e. the green and red OLEDs). In this manner, it is possible to have the first capping layer optimized for the light emissions in the blue spectrum (because the first capping layer may be optimized for only the blue OLEDs), while simultaneously optimizing the second capping layer for either the red or green OLEDs (or the second capping layer may have an optical thickness that is a compromise between the optimal optical thickness for each device). Moreover, in some embodiments, the second portion, of the plurality of OLEDs comprises only a plurality of the red OLEDs or a plurality of the green OLEDs. The second capping layer may thereby be optimized for either of the light emissions of the green or red OLEDs.

In some embodiments, in the first method as described above in which a plurality of OLEDs are provided on a substrate and a first and second capping layer are deposited so as to be optically coupled to a first and second portion of the OLEDs, respectively, and in which the plurality of OLEDs include a plurality of red OLEDs, a plurality of green OLEDs, and a plurality of blue OLEDs, the plurality of OLEDs may also include a third portion of OLEDs that is different from the first and second portions. The method may further include the step of depositing a third capping layer over at least the third portion of the plurality of OLEDs such that the third capping layer is optically coupled to at least the third portion of the plurality of OLEDs. The addition of a third capping layer may allow for the optimization of the emissions for OLEDs having three different color emissions (e.g. red, blue, and green). Although it is possible to obtain three different optical thicknesses using only two depositions of capping layers, it may be more practical to utilize three deposition processes (as it may be difficult to provide three different thicknesses that each optimize the light emission from a different OLED color). Exemplary embodiments of such configurations are shown in FIGS. 3-7 and 9, and will be described in more detail below. In some embodiments, the third capping layer is not optically coupled to the first portion and the second portion of the plurality of OLEDs. That is, the third capping layer may not be common to all, or substantially all of the OLEDs of the device (i.e. it may not be a blanket layer). Moreover, by providing capping layers that are not common to all of the other OLEDs, embodiments may provide non-common capping layers that may be optimized for a particular subset of the OLEDs of a device (e.g. based on the color of the emission). In some embodiments, the third capping layer is not optically coupled to the first portion or the second portion of the plurality of OLEDs. This may provide for a unique optical thickness for the third capping layer (or a unique optical thickness for the total capping layer in optical communication with the third portion of the plurality of OLEDs), even in embodiments whereby the first and second capping layers are common to the third portion and either the first and/or second portion of OLEDs (see e.g. FIG. 7, discussed below). In some embodiments, the third capping layer is not deposited through a patterned mask and, preferably, through an FMM. Again, as described above, deposition through a FMM or other traditional deposition processes can be, for instance, cost prohibitive when providing multiple non-common capping layers. Thus, like the second capping layer, the inventors have recognized the benefits of depositing the third capping layer using these alternative techniques, such as using at least one of: laser induced thermal imaging (LITI) or laser induced pattern-wise sublimation (LIPS). As noted above, embodiments and features described herein may be combined and utilized with methods of fabricating devices, and the devices themselves, that comprise non-common capping layers that are deposited using such alternative deposition techniques (i.e. not through the use of an FMM).

Continuing with exemplary embodiments in which the plurality of OLEDs include a plurality of red OLEDs, a plurality of green OLEDs, and a plurality of blue OLEDs, where the plurality of OLEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the step of depositing the third capping layer may comprise depositing the third capping layer onto portions of a second substrate and aligning the third capping layer over the third portion of the plurality of OLEDs. This process was discussed above with regard to a similar deposition process for the second capping layer. An exemplary embodiment whereby both the first and the second capping layer are deposited in such a manner is shown in FIG. 9, which will be described in more detail below. The third capping layer may be deposited onto the second substrate using, for example, at least one of: photolithography, LITI, LIPS, stamping, or inkjet printing. As was described above, embodiments where the capping layer or layers are deposited on a second substrate allow for more options in the deposition process, typically a reduction in cost, and usually more error tolerance because the substrate does not comprise organic material, which may often be sensitive to such processes. In some embodiments, the third capping layer may be aligned with the third portion of OLEDs by depositing the third capping layer onto portions of the second substrate such that the third capping layer is optically coupled to the third portion of the plurality of OLEDs when the second substrate is coupled to the first substrate. The third capping layer may also be optically coupled to the first capping layer when the first substrate is coupled to the second substrate. This may be the case in embodiments where the first capping layer is a blanket layer, or is common to both the first and third portions of the plurality of OLEDs. A non-limiting example of such an embodiment is shown in FIG. 9. In some embodiments, the second substrate is a display cover ad may serve to encapsulate the organic devices when it is coupled to the substrate that has the OLEDs disposed thereon.

Continuing with the first method as described above in which the plurality of OLEDs include a plurality of red OLEDs, a plurality of green OLEDs, and a plurality of blue OLEDs, where the plurality of OLEDs also includes a third portion of OLEDs that is different from the first and second portions, and where the method includes the step of depositing a third capping layer over at least the third portion of the plurality of OLEDs such that the third capping layer is optically coupled to at least the third portion of the plurality of OLEDs, tile first, second, and third portions of the plurality of OLEDs may each comprise OLEDs of various different colors. For instance, in some embodiments the third portion of the plurality of OLEDs may comprise only a plurality of the red OLEDs, the second portion of the plurality of OLEDs may comprise only a plurality of the green OLEDs, and the first portion of the plurality of OLEDs may comprise only a plurality of the blue OLEDs. In this manner, it may be possible to optimize the total capping layer over each of the plurality of OLEDs (i.e. for each color). That is, the total capping layer over each OLED in the first portion of the plurality of OLEDs may be the same (and may optimize the blue emissions), the total capping layer over each OLED of the second portion may be the same (and may optimize the red emissions), and the total capping layer over each OLED of the third portion may be the same (and may optimize the green emissions). It should be understood that it is possible to have any color OLED comprise each of the first, second, and third portions of the plurality of OLEDs as described above. For instance, the third portion of the plurality of OLEDs may comprise only a plurality of the green OLEDs, the second portion of the plurality of OLEDs may comprise only a plurality of the red OLEDs, and the first portion of the plurality of OLEDs may comprise only a plurality of the blue OLEDs. It follows thereby that embodiments may also comprise any combination of the first, second, and third capping layers such that the total capping layer over each of the first, second, and third portion of OLEDs is optimized.

In some embodiments, in the first method as described above in which a plurality of OLEDs are provided on a substrate and a first and second capping layer are deposited so as to be optically coupled to a first and second portion of the OLEDs, respectively, and in which the plurality of OLEDs include a plurality of red OLEDs, a plurality of green OLEDs, and a plurality of blue OLEDs, the first capping layer may have a thickness that is optimized for at least one of the plurality of red OLEDs, green OLEDs, and blue OLEDs. That is, the first capping layer as described above may be designed to have an optical thickness to optimize the emissions of any of the OLEDs in the device, without the need for any additional capping layers. However, in some embodiments, it may be preferred that the first capping layer has a thickness that is optimized for the plurality of blue OLEDs. This is due in part to the fact that the blue emission is typically optimized by utilizing the least thick (i.e. thinnest) capping layer. It is preferred that the first capping layer have a thickness that optimizes the light emission for the shortest wavelength OLED because the first capping layer may then be a blanket layer such that it is common to all, or substantially all, of the OLEDs of the device. The second and third capping layers may then be disposed over the first capping layer and optically coupled to OLEDs that emit light having a higher wavelength because the optical thickness of the capping layer for these devices is usually greater. Thereby, the first capping layer can be used in conjunction with the second and third capping layers for a total capping layer over the second and third portions of the plurality of OLEDs. In some embodiments, the first capping layer has an optical thickness that is less than approximately 125 nm. In some embodiments, the first capping layer is within the range of 90 to 130 nm. This range typically includes the optical thickness to optimize the blue OLEDs.

In general, it may be preferred that to optimize the emissions of the OLEDs in the exemplary method, that the optical thickness of the capping layer (or layers) that is optically coupled to the OLED (having emissions of a particular wavelength—i.e. color) be set to approximately the quarter wavelength of the OLED light emission. This may thereby reduce interference patterns and establish a maximum as to the amount of light emissions. However, as would be understood by one of skill in the art, there are many optical thicknesses that may be chosen—in part due to the periodic nature of electromagnetic waves.

The capping layers may comprise many different characteristics. For instance, the first capping layer may comprise any suitable materials, such as those that are frequently used and known in the art, which may include $Alq_3$. In some embodiments, the first capping layer is substantially transparent for light having a wavelength, approximately equal to a wavelength of light that is emitted by each OLED that the first capping layer is optically coupled to. It is preferred that the capping layer is transparent so as to reduce emission loses of the organic devices. In some embodiments, the first capping layer has an index of refraction that is approximately in the range of 1 and 2.5. Typically, the higher the index of refraction, the less physical thickness is needed for the capping layers (because the optical thickness is the product of the physical thickness and the index of refraction). However, the increase in index of refraction may also decrease the critical angle at the boundary of the capping layer and may introduce additional types of losses. Thus, it may preferable that, the first capping layer has an index of refraction that is approximately within the range of 1.5 and 2. In some embodiments, the first capping layer has an optical thickness that results in a loss of efficiency for the plurality of green OLEDs that is within the range of approximately 5 to 10%. This loss may be due to the first capping layer having an optical thickness that is optimized for the blue emission OLEDs. Similarly, the first capping layer may have an optical thickness that results in a loss of efficiency for the plurality of red OLEDs that is within the range of approximately 25 to 35%—which again may be typical when the first capping layer is optimized for the blue OLEDs.

Furthermore, in some embodiments, the second capping layer may have a thickness that is optimized for the plurality of red OLEDs and/or the plurality of green OLEDs. When the second capping layer is optimized for the plurality of green OLEDs, it may have an optical thickness that is approximately within the range of 125 to 160 nm, which is a range of values for which the capping layer is optimized for green emission OLEDs. It should be noted that in some embodiments, such as when another capping layer (such as the first capping layer) is common to the second portion of OLEDs, that this range may correspond to the optical thickness of the total capping layer that is in optical communication with die second portion of the plurality of OLEDs. That is, in this exemplary embodiment, the second capping layer may have an optical thickness that is less than that needed to optimize the green OLEDs alone, but when the first and the second capping layers are combined, the total optical thickness may optimize the light emissions. This is illustrated in FIGS. 3, 5-9. Similar to the first capping layer, the second capping layer may comprise any suitable material, such as $Alq_3$. The second capping layer may also be substantially transparent for light having a wavelength approximately equal to a wavelength of light that is emitted by each OLED that the second capping layer is optically coupled to. Moreover, similar to the first capping layer, in some embodiments, the second capping layer may have an index of refraction that is approximately in the range of 1 and 2.5 and preferably is approximately within the range of 1.5 and 2. This was described above with reference to the first capping layer.

In some embodiments, where the plurality of OLEDs also include a third portion of OLEDs that is different from the first and second portions, and where the method includes the step of depositing a third capping layer over at least the third portion of the plurality of OLEDs such that the third capping layer is optically coupled to at least the third portion of the plurality of OLEDs, the third capping layer may have an optical thickness that is optimized for any of the OLED colors. For instance, the optical thickness may be optimized for the plurality of red OLEDs and/or the plurality of green OLEDs. This may be the case in embodiments whereby the first or the second capping layer was optimized for the blue OLEDs. In some embodiments, when the third capping layer has an optical thickness that is optimized for the red OLEDs, the third capping layer has a thickness that is approximately within the range of 160 to 200 nm. As described above, when the first or the second capping layer is common to the third portion of the plurality of OLEDs, then the third capping layer may have an optical thickness such that the total optical thickness of the total capping layer that is optically coupled to the third portion of the plurality of OLEDs is optimized. As with the first and the second capping layers, the third capping layer may comprise any suitable material, such as $Alq_3$. The third capping layer may be substantially transparent for light having a wavelength approximately equal to a wavelength of light that is emitted by each OLED that the third capping layer is optically coupled to. Moreover, in some embodiments, the third capping layer may have an index of refraction that is approximately in the range of 1 and 2.5 and preferably approximately within the range of 1.5 and 2.

As was described above, the first, second, and third capping layers may each be designed so as to optimize one of the emission colors simultaneously. For instance, in some embodiments, the first capping layer has a thickness that is optimized for the plurality of blue OLEDs, the second capping layer has a thickness that is optimized for the plurality of green OLEDs, and the third capping layer has a thickness that is optimized for the plurality of red OLEDs. In such embodiments, the device as a whole may then operate at a higher efficiency because the emissions from each color OLED is also optimized. It should be noted that each capping layer by itself does not have to provide the entire optical thickness for optimizing an OLED, but may be designed to combine with other capping layers that are also optically coupled to an OLED. In some embodiments, the first capping layer has an optical thickness that is approximately within the range of 90 to 130 nm, the second capping layer has an optical thickness that is approximately within the range of 125 to 160 nm, and the third capping layer has an optical thickness that is approximately within the range of 160 to 200 nm. This may correspond to the optimal thicknesses for optimizing blue, green, and red OLEDs respectively.

Exemplary Embodiments of Apparatuses

In addition to the exemplary methods described, provided herein are descriptions of exemplary apparatuses. Again, as described below, the embodiments are for illustration purposes only, and are not meant to be limiting.

A first apparatus is provided that comprises a plurality of OLEDs, each OLED having a first electrode, a second electrode disposed over the first electrode; and an organic electroluminescent (EL) material disposed between the first and the second electrodes. In some embodiments, the OLEDs may be disposed over a common substrate such that there light emissions may combined (as in a display). The first apparatus further includes a first capping layer that is disposed over the second electrode of at least a first portion of the plurality of OLEDs such, that the first capping layer is optically coupled to at least the first portion of the plurality of OLEDs. In this manner, the first capping layer may increase the efficiency of the emissions of at least the first portion of the plurality of OLEDs, as was described above. The first apparatus also comprises a second capping layer. The second capping layer may be disposed over the second electrode of at least a second portion of the plurality of OLEDs such that the second capping layer is optically coupled to the second portion of the plurality of OLEDs but not the first portion of the plurality of OLEDs. In this manner, the optical thickness of the total capping layer that is optically coupled to the second portion of the plurality of OLEDs (which may comprise the second capping layer alone or in some combination with another capping layer) may be different than that which is optically coupled to the first plurality of OLEDs. This may, in some embodiments, provide the ability to optimize more than a single color OLED in such devices.

In some embodiments, the second capping layer in the first apparatus described above was not deposited through a FMM or by VTE. That is, as was described in detail above, the capping layers may have been deposited using an alternative deposition technique that has not heretofore been utilized for disposing the capping layers on a device. In some embodiments, these techniques may include LITI and LIPS, which may be preferred because the capping layers are not electrically active. In some embodiments, the plurality of OLEDs comprise a plurality of red OLEDs, a plurality of blue OLEDs, and a plurality of green OLEDs, such as when the device comprises a display or a light fixture. Moreover, in some embodiments, the second capping layer of the first apparatus is not disposed over at least one of the plurality of red OLEDs, green OLEDs, and blue OLEDs. In this manner, it may be possible to have at least two of the OLEDs to be optically coupled to a total capping layer that has a different optical thickness than the other OLEDs. This may then allow for the optimization of the emission of at least two of the OLED colors. For instance, in some embodiments, the second capping layer is not disposed over the plurality of blue OLEDs. This may be the case when the first capping layer has an optical thickness that is optimized for the blue OLEDs such that an additional capping layer optically coupled to the blue OLEDs may not be necessary to achieve optimization.

In some embodiments, in the first apparatus as described above where the plurality of OLEDs comprise a plurality of red OLEDs, a plurality of blue OLEDs, and a plurality of green OLEDs, and where the plurality of OLEDs further comprise a third portion of OLEDs that is different from the first and second portions, the apparatus further comprises a third capping layer disposed over the second electrode of at least the third portion of the plurality of OLEDs such that the third capping layer is optically coupled to at least the third portion of the plurality of OLEDs. As was described above, the addition of a third capping layer may make it more readily achievable to optimize three separate OLED emission colors. In some embodiments, the third capping layer is not optically coupled to the first or the second portions of the plurality of OLEDs. An example of this embodiment is show in FIG. 4, described below. This may permit each capping layer to be designed so as to optimize the emissions of one portion of the plurality of OLEDs, without the need to combine the optical effect of the other capping layers. In some embodiments, the third capping layer was not deposited through a FMM or VTE, which provides the same benefits as was described above. In some embodiments, the second capping layer is not optically coupled to the plurality of blue OLEDs or the plurality of green OLEDs and the third capping layer is not optically coupled to the plurality of red OLEDs or the plurality of blue OLEDs. An example of this embodiment is shown FIG. 4, which will be described in detail below.

DESCRIPTION OF THE FIGURES

The remaining figures will now be described in more detail. The figures represent exemplary embodiments and are not meant to be limiting. Many of the figures were referenced above and thereby may pertain to the description provided as indicated.

Each of the exemplary devices shown in FIGS. 3-9 comprise a plurality of OLEDs (310, 311, and 312) that emit different colors (e.g. red, green and blue respectively), each having a first electrode 321 and a second electrode 322, where the second electrode 322 are the top electrodes. Each of the OLE'Ds are disposed on a first substrate 300. The first substrate may, for instance, comprise a backplane and/or TFT substrate. The remaining characteristics will be described in detail with respect to each figure.

Figure 3:
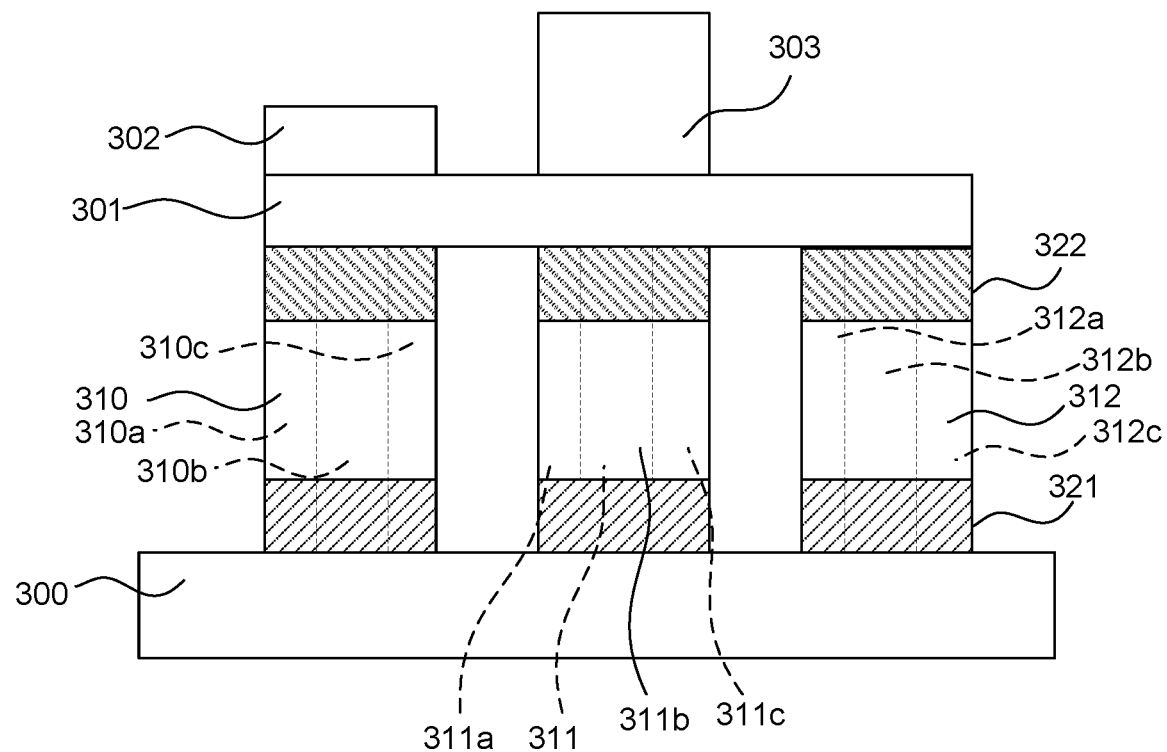
FIG. 3 illustrates a side view of an exemplary device in accordance with embodiments described herein.

FIG. 3 shows a side view of an exemplary embodiment comprising a first capping layer 301, a second capping layer 302, and a third capping layer 303. As shown, the first capping layer 301 is disposed over the top electrode 322 of each of the OLEDs 310, 311, and 312 so as to be optically coupled to each organic device. Therefore, the first capping layer is common to OLEDs 310, 311, and 312. This may have the advantage of allowing the first capping layer 301 to be deposited as a blanket layer, and thus not require deposition through a FMM or other process. As depicted, the first capping layer may have an optical thickness that is optimized for the OLED 312 (e.g. the blue OLED). Also shown are a second capping layer 302 that is optically coupled to both the first capping layer 301 and OLED 310; as well as a third capping layer 303 that is optically coupled to the first capping layer 301 and the OLED 311. In some embodiments, the total capping layer of the first capping layer 301 and second capping layer 302 may have a total optical thickness that optimizes OLED 310. Similarly, in some embodiments, the total capping layer of the first capping layer 301 and third capping layer 303 may have a total optical thickness that optimizes OLED 311. Thus, as depicted in FIG. 3, the exemplary embodiment may comprise a single common capping layer 301 that optimizes one OLED 312 and a second 302 and third 303 capping layer so as to maximize the other OLEDs that may emit light of a different color. In this manner, the device in FIG. 3 may be optimized.

FIG. 4 shows a side view of an exemplary embodiment comprising a first capping layer 401, a second capping layer 402, and a third capping layer 403. Unlike the exemplary device in FIG. 3, the first capping layer 401 is not common to the plurality OLEDs 310, 311, and 312. Indeed, none of the capping layers are shown as optically coupled to any of the other capping layers, and none of the capping layers is common to a plurality of different color OLEDs. In this embodiment, each of the capping layers 401, 402, and 403 may have an optical thickness that optimizes each of the OLEDs 310, 311, and 312 respectively.

Figure 5:
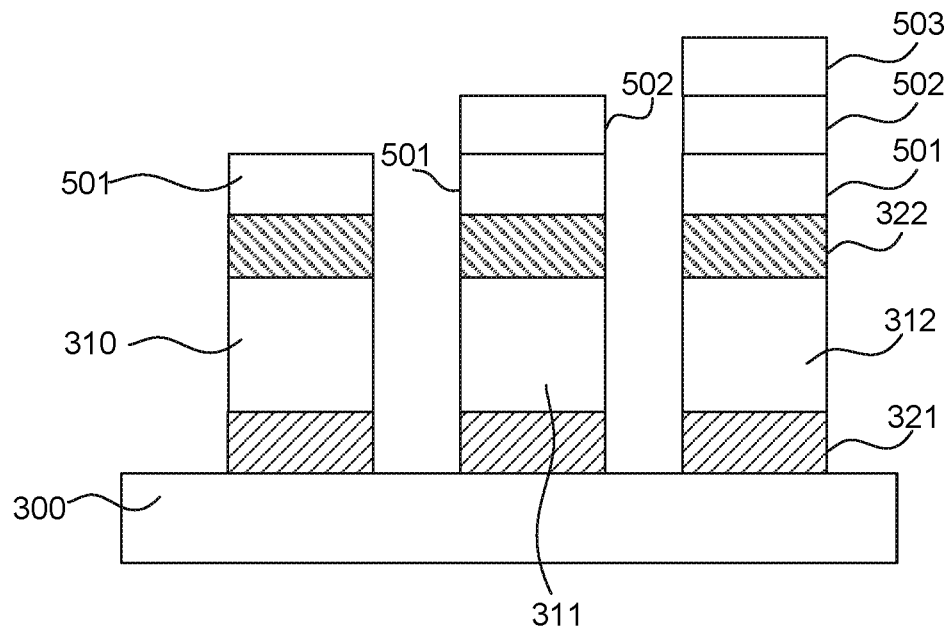
FIG. 5 illustrates a side view of an exemplary device in accordance with embodiments described herein.

FIG. 5 shows a side view of an exemplary embodiment comprising a first capping layer 501, a second capping layer 502, and a third capping layer 503. As depicted, capping layer 501 is common to all three OLEDs and capping layer 502 is common to OLEDs 311 and 312. Capping layer 503 is optically coupled to only OLED 312. Each capping layer 501, 502, and 503 is shown has comprising the same optical thickness. However, the total optical thickness of the total capping layer for each OLED in FIG. 5 is different based on the difference in the number of depositions of the capping layers over each device. Thus, in these embodiments, it may be possible to apply the same deposition process and materials, but have three different capping layers—one for each of the different color OLEDs. It may also be possible to apply different materials having the same thickness.

Figure 6:
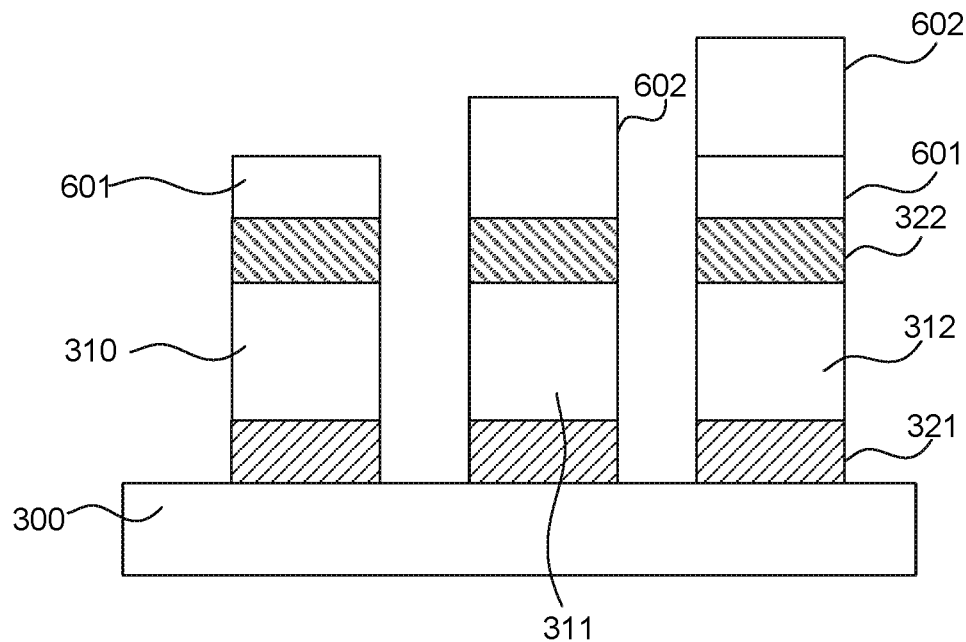
FIG. 6 illustrates a side view of an exemplary device in accordance with embodiments described herein.

FIG. 6 shows a side view of an exemplary embodiment comprising a first capping layer 601 and second capping layer 602. As shown, capping layer 601 is common to both OLED 310 and 312; and capping layer 602 is common to OLEDs 311 and 312. This embodiment illustrates that it is possible to have a device that comprises three different total capping layers while utilizing only two capping layers. That is, OLED 310 has a total capping layer comprising capping layer 601; OLED 311 has a total capping layer comprising capping layer 602; and OLED 312 has a total capping layer comprising capping layers 601 and 602. These embodiments have the advantage of only utilizing two deposition processes for depositing the capping layers, which may reduce time and costs of manufacturing.

Figure 7:
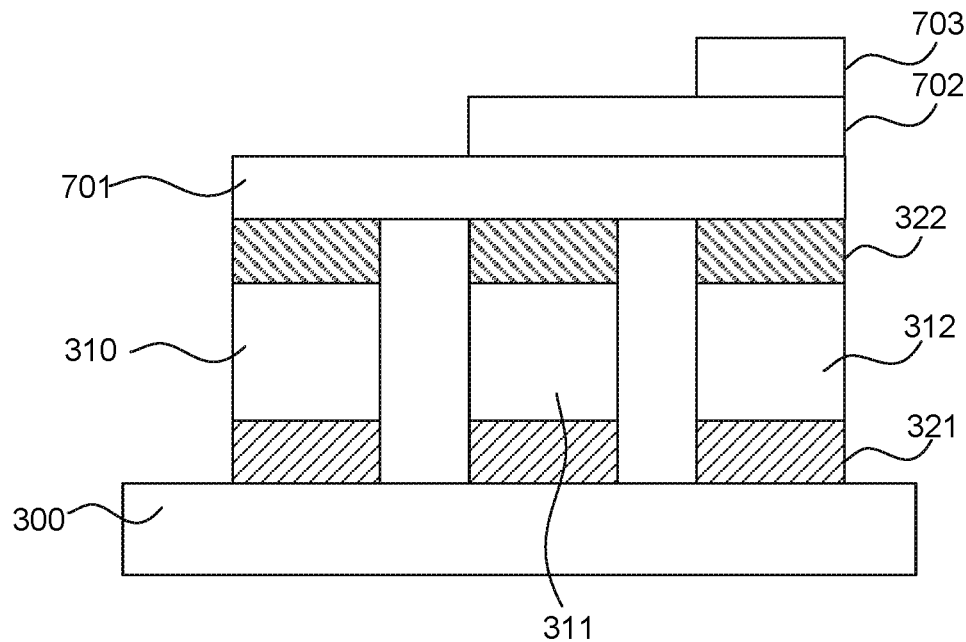
FIG. 7 illustrates a side view of an exemplary device in accordance with embodiments described herein.

FIG. 7 shows a side view of an exemplary embodiment comprising a first capping layer 701, a second capping layer 702, and a third capping layer 703. As depicted, FIG. 7 is almost identical to FIG. 5 in that capping layer 701 is common to all three OLEDs, capping layer 702 is common to OLEDs 311 and 312, and capping layer 503 is optically coupled to only OLED 312. However, FIG. 7 shows an embodiment whereby the capping layers comprise different physical thicknesses. Thus, this embodiment may have the advantage of providing increased adaptability so as to more readily optimize the emissions of each of the OLEDs.

FIGS. 8 and 9 depict exemplary embodiments whereby the capping layers are deposited on a second substrate 830, such as a display panel, which is then coupled to the first substrate 300. As shown in FIG. 8, only a single capping layer 802 is disposed on the second substrate 830. The capping layer 802 is positioned such that when the substrates 300 and 830 are coupled, it is aligned with OLED 310. Thus, OLED 310 will be optically coupled to the common capping layer 801 and capping layer 802. Both OLEDs 311 and 312 are only optically coupled to capping layer 801. As was described above, this may be the case for embodiments whereby capping layer 801 is optimized for blue OLEDs. Typically in such exemplary embodiments, the red OLED (e.g. OLED 310 in FIG. 8) has the greatest loss of efficiency. Thus providing capping layer 802 may offset or optimize OLED 310. It should be understood that some or all of the capping layers may be deposited on the second substrate 830, and in any combination, such as those discussed with reference to FIGS. 3-7.

FIG. 9 is similar to FIG. 8 in that the capping layers 902 and 903 are disposed on the second substrate 830, which may then be aligned and coupled to the first substrate 300. As shown, when the first 300 and second 830 substrate are coupled, capping layer 901 is common to all three OLEDs, capping layer 902 is common to OLEDs 311 and 312, and capping layer 903 is optically coupled to only OLED 312. Thus, the result is similar to the net effect provided by the capping layers in FIGS. 5 and 7.

It should be appreciated that many more combinations of capping layers having the same or different optical properties may be provided so as to obtain different total optical thicknesses optically coupled to each of a plurality of different color OLED devices. However, the general principles remain the same as disclosed herein and are thereby contemplated as being within embodiments.

Simulation Results—Power Consumption Calculation

The inventors have also performed simulations on an exemplary device comprising different capping layers for each of the different color OLEDs. The exemplary device had the following characteristics: The display size was 4-inches (diagonal length) and all parameters were calculated for a total display brightness of 300 cd/m$^2$ for a white point with 40% of the pixels turned on. The thin film transistors (TFT) had a voltage of 5.5V and the OLEDs each had a voltage of 4V. The lighting panel also bad a circular polarizer applied which attenuated the total panel transmission to 44%. The 1931 CIE coordinates for each of the OLED colors is as follows: red (0.67, 0.32) green (0.21, 0.71) and blue (0.13, 0.058). The combined white emission of the device had a CIE coordinate of (0.29, 0.30).

Table 1 below shows the results of the simulations for power consumption for the exemplary 4-inch display described above, where the display has (1) the red, green, and blue pixels optimized separately with different capping layer optical thicknesses and (2) where the capping layer is optimized for the blue pixels only, but is common to red, green and blue pixels: The capping layer optically coupled to the red OLED comprised 100 nm of $Alq_3$ and had an optical thickness of 170 nm. The capping layer optically coupled to the green OLED comprised 80 nm of $Alq_3$ and had an optical thickness of 138 nm. The capping layer optically coupled to the blue OLED comprised 70 nm of $Alq_3$ and had an optical thickness of 125 nm.

TABLE 1

Simulation Results of Exemplary Device

|  | Red Light Emission luminous efficacy [cd/A] | Green Light Emission luminous efficacy [cd/A] | Blue Light Emission luminous efficacy [cd/A] | Power Consumption of Display [W] |
|---|---|---|---|---|
| (1) RGB optimized capping layer | 46 | 116 | 7.8 | 0.300 |
| (2) B only optimized capping layer | 32 | 104 | 7.8 | 0.343 |

As can be seen in Table 1, the light emission for this exemplary embodiment substantially increases for the red OLEDs (approximately 43.75% increase in luminance) and the green OLEDs (approximately 11.54% increase in luminance) when the capping layer that is optically coupled to each is optimized. The light emission from the blue OLEDs, as expected, remained the same as the capping layer optically coupled to these devices had the same optical thickness in both simulations. As a result of the optimization for each capping layer, the power consumption of the display decreased by 0.043 W (approximately 14.33%) as compared to the device having only a single optimized capping layer. Thus, the simulation confirms that devices that comprise capping layers that are optimized for each of the OLED colors have higher emission levels and thereby lower power consumption. The reduced power consumption and resulting increase in efficiencies may also lead to longer lifetimes of the devices. For example, using a typical red phosphorescent OLED acceleration factor of two, the lifetime of the red pixel in case 1 (i.e. when the red OLED is optimized) can be expected to be 2.1 times longer than the device in case 2 (i.e. not optimized) for the same initial luminance.

It is understood that the various embodiment; described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

We claim:

1. An apparatus comprising:
   an OLED provided on a first substrate, wherein the OLED comprises:
      a first electrode;
      a second electrode disposed over the first electrode; and
      an organic electroluminescent (EL) material disposed between the first and the second electrodes wherein the OLED comprising a first, a second, and a third portions;
   a first capping layer disposed over the second electrode of the first, the second, and the third portions of the OLED,
      wherein the first capping layer and the second electrode are in contact with each other throughout the first, the second, and the third portions of the OLED such that the first capping layer is optically coupled to the first, the second, and the third portions of the OLED,
      wherein substantially all of the light emitting from the first, the second, and the third portions of the OLED in a direction perpendicular to the second electrode propagates through the first capping layer so that the first capping layer enhances the amount of light outcoupled from the underlying first, the second, and the third portions of the OLED;
   a second capping layer disposed over the second portion of the OLED and in contact with the first capping layer throughout the second portion of the OLED, such that the second capping layer is optically coupled to the first capping layer and the second portion of the OLED but not the first portion of the OLED, wherein the second portion of the OLED is different from the first portion of the OLED;
   wherein substantially all of the light emitting from the second portion of the OLED in a direction perpendicular to the second electrode and propagating through the first capping layer also propagates through the second capping layer so that the first capping layer and the second capping layer enhance the amount of light outcoupled from the underlying second portion of the OLED,
   wherein the third portion of the OLED is different from the first and second portions, further comprising a third capping layer disposed over the third portion of the OLED and in contact with the first capping layer throughout the third portion of the OLED such that the third capping layer is optically coupled to the first capping layer and the third portion of the OLED but not the first portion or the second portion,
   wherein substantially all of the light emitting from the third portion of the OLED in a direction perpendicular to the second electrode and propagating through the first capping layer also propagates through the third capping layer so that the first capping layer and the third capping layer enhance the amount of light outcoupled from the underlying third portion of the OLED;
   wherein the second capping layer is not optically coupled to the third portion of the OLED; and
   wherein the first portion of the OLED comprises a plurality of blue OLEDs, the second portion of the OLED comprises a plurality of green OLEDs, and the third portion of the OLED comprises a plurality of red OLEDs.

2. The apparatus of claim 1, wherein the first capping layer has a first total optical path that is constant over the first portion of the OLED;
   wherein the second capping layer has a second total optical path that is constant over the second portion of the OLED; and
   wherein the first total optical path and the second total optical path are different.

3. The apparatus of claim 1, wherein the first capping layer has a thickness that is optimized for the plurality of blue OLEDs.

4. The apparatus of claim 1, wherein the second capping layer has a thickness that is optimized for the plurality of green OLEDs.

5. The apparatus of claim 1, wherein the third capping layer has a thickness that is optimized for the plurality of red OLEDs.

6. An apparatus comprising:
   an OLED provided on a first substrate, wherein the OLED comprises:
      a first electrode;
      a second electrode disposed over the first electrode; and
      an organic electroluminescent (EL) material disposed between the first and the second electrodes wherein the OLED comprising a first, a second, and a third portions;
   a first capping layer disposed over the second electrode of the first, the second, and the third portions of the OLED,
      wherein the first capping layer and the second electrode are in contact with each other throughout the first, the second, and the third portions of the OLED such that the first capping layer is optically coupled to the first, the second, and the third portions of the OLED,
      wherein substantially all of the light emitting from the first, the second, and the third portions of the OLED in a direction perpendicular to the second electrode propagates through the first capping layer so that the first capping layer enhances the amount of light outcoupled from the underlying first, the second, and the third portions of the OLED;
   a second capping layer disposed over the second portion of the OLED and in contact with the first capping layer throughout the second portion of the OLED, such that the second capping layer is optically coupled to the first capping layer and the second portion of the OLED but not the first portion of the OLED, wherein the second portion of the OLED is different from the first portion of the OLED;
   wherein substantially all of the light emitting from the second portion of the OLED in a direction perpendicular to the second electrode and propagating through the first capping layer also propagates through the second capping layer so that the first capping layer and the second capping layer enhance the amount of light outcoupled from the underlying second portion of the OLED, wherein the third portion of the OLED is different from the first and second portions, further comprising a third capping layer disposed over the third portion of the OLED and in contact with the first capping layer throughout the third portion of the OLED such that the third capping layer is optically coupled to the first capping layer and the third portion of the OLED but not the first portion or the second portion of the OLED, wherein substantially all of the light emitting from the third portion of the OLED in a direction perpendicular to the second electrode and propagating through the first capping layer also propagates through the third capping layer so that the first capping layer and the third capping layer enhance the amount of light out-coupled from the underlying third portion of the OLED;

wherein the second capping layer is not optically coupled to the third portion of the OLED; and wherein one of the first, second, and third portions of the OLED comprises a plurality of red OLEDs, another of the first, second, and third portions of the OLED comprises a plurality of blue OLEDs, and remaining one of the first, second, and third portions of the OLED comprises a plurality of green OLEDs.

7. The apparatus of claim 6, wherein at least one of the second capping layer and the third capping layer is deposited through a coarse mask or no mask and is not deposited through a fine metal mask (FMM).

8. The apparatus of claim 6, wherein the first capping layer has a first total optical path that is constant over the first portion of the OLED;

wherein the second capping layer has a second total optical path that is constant over the second portion of the OLED; and wherein the first total optical path and the second total optical path are different.

9. The apparatus of claim 6, wherein the third capping layer is not deposited through a fine metal mask.

10. The apparatus of claim 6, wherein the first capping layer has a first total optical path that is constant over the first portion of the OLED and the third capping layer has a third total optical path that is constant over the third portion of the OLED, and wherein the first total optical path and the third total optical path are different.

11. The apparatus of claim 6, wherein the first capping layer has a first total optical path that is constant over the first portion of the OLED, wherein the second capping layer has a second total optical path that is constant over the second portion of the OLED, wherein the third capping layer has a third total optical path that is constant over the third portion of the OLED, and wherein the first total optical path, the second total optical path, and the third total optical path are different.

12. The apparatus of claim 6, wherein each of the first, second, and third capping layers are less than 200 nm thick.

13. The apparatus of claim 6, wherein the second capping layer is disposed over the second electrode of the second portion of the OLED by depositing the second capping layer by at least one of laser induced thermal imaging (LITI), laser induced pattern-wise sublimation (LIPS), VTE, and OVJP.

14. The apparatus of claim 13, wherein depositing the second capping layer comprises depositing the second capping layer onto portions of a second substrate and aligning the second capping layer over at least the second portion of the OLED.

15. The apparatus of claim 6, wherein the third capping layer is disposed over the second electrode of at least the third portion of the OLED by depositing the third capping layer by at least one of laser induced thermal imaging (LITI), laser induced pattern wise sublimation (LIPS), VTE, and OVJP.

16. The apparatus of claim 15, wherein depositing the third capping layer comprises depositing the third capping layer onto portions of a second substrate and aligning the third capping layer over at least the third portion of the OLED.

17. The apparatus of claim 6, wherein the first capping layer has a thickness that is optimized for the plurality of blue OLEDs.

18. The apparatus of claim 17, wherein the second capping layer has a thickness that is optimized for the plurality of red OLEDs and/or the plurality of green OLEDs.

19. The apparatus of claim 18, wherein the third capping layer has a thickness that is optimized for the plurality of red OLEDs and/or the plurality of green OLEDs.

* * * * *